United States Patent
Kim et al.

(10) Patent No.: US 11,132,312 B2
(45) Date of Patent: Sep. 28, 2021

(54) METHOD OF CONTROLLING INITIALIZATION OF NONVOLATILE MEMORY DEVICE AND MEMORY SYSTEM INCLUDING NONVOLATILE MEMORY DEVICE

(71) Applicant: Samsung Electronics Co., Ltd., Suwon-si (KR)

(72) Inventors: Jinyoung Kim, Seoul (KR); Jaeduk Yu, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/835,922

(22) Filed: Mar. 31, 2020

(65) Prior Publication Data
US 2021/0097010 A1 Apr. 1, 2021

(30) Foreign Application Priority Data
Oct. 1, 2019 (KR) ........................ 10-2019-0121430

(51) Int. Cl.
*G11C 11/56* (2006.01)
*G06F 13/16* (2006.01)
(Continued)

(52) U.S. Cl.
CPC ..... *G06F 13/1694* (2013.01); *G01R 31/2831* (2013.01); *G06F 11/0787* (2013.01);
(Continued)

(58) Field of Classification Search
CPC ............. G06F 13/1694; G06F 11/0787; G06F 13/1657; G01R 31/2831; G11C 11/5642;
(Continued)

(56) References Cited

U.S. PATENT DOCUMENTS 5,574,857 A * 11/1996 Ramakrishnan ....... G11C 29/52
714/42
5,978,352 A * 11/1999 Imaizumi ............ B60R 16/0315
370/216
(Continued)

FOREIGN PATENT DOCUMENTS

JP 2004-0118921 A 4/2004
JP 2005-0108304 A 4/2005
(Continued)

*Primary Examiner* — Michael T Tran
(74) *Attorney, Agent, or Firm* — Harness, Dickey & Pierce, P.L.C.

(57) ABSTRACT

To control initialization of a nonvolatile memory device, before assembling a memory system including a first nonvolatile memory device and a second nonvolatile memory device, information data for initialization of the first nonvolatile memory device are stored in the first nonvolatile memory device. After assembling the memory system, the information data are moved from the first nonvolatile memory device to the second nonvolatile memory device. The first nonvolatile memory device is initialized based on the information data stored in the second nonvolatile memory device. An initialization time of the first nonvolatile memory device is reduced efficiently by moving the information data from the first nonvolatile memory device to the second nonvolatile memory device having the rapid speed of the reading operation and using the information data read from the second nonvolatile memory device.

19 Claims, 25 Drawing Sheets

(51) Int. Cl.
  *G06F 11/07* (2006.01)
  *G01R 31/28* (2006.01)
  *G11C 7/20* (2006.01)

(52) U.S. Cl.
  CPC .......... *G06F 13/1657* (2013.01); *G11C 7/20* (2013.01); *G11C 11/5628* (2013.01); *G11C 11/5642* (2013.01); *G11C 11/5678* (2013.01)

(58) Field of Classification Search
  CPC .... G11C 11/5628; G11C 7/20; G11C 11/5678
  USPC .................................................. 711/105, 154
  See application file for complete search history.

(56) References Cited

U.S. PATENT DOCUMENTS

| | | | |
|---|---|---|---|
| 6,947,318 B1 | 9/2005 | Fujita | |
| 6,987,688 B2 | 1/2006 | Lowrey et al. | |
| 7,353,324 B2 | 4/2008 | Tanaka | |
| 7,958,287 B2 | 6/2011 | Tanaka | |
| 7,958,288 B2 | 6/2011 | Tanaka | |
| 7,996,634 B2 | 8/2011 | Tanaka | |
| 8,001,337 B2 | 8/2011 | Tanaka | |
| 8,183,883 B1* | 5/2012 | Tan | G06F 30/34 326/39 |
| 8,332,575 B2 | 12/2012 | Kim et al. | |
| 8,397,035 B2* | 3/2013 | Tanaka | G06F 3/0683 711/154 |
| 8,706,978 B2 | 4/2014 | Tanaka | |
| 8,719,610 B2 | 5/2014 | Nowak et al. | |
| 8,788,741 B2* | 7/2014 | Kwon | G06F 11/004 711/103 |
| 8,837,211 B2 | 9/2014 | Jurasek | |
| 8,904,142 B2 | 12/2014 | Tanaka | |
| 8,924,638 B2 | 12/2014 | Carannante et al. | |
| 8,976,580 B2 | 3/2015 | Lee et al. | |
| 9,207,949 B2 | 12/2015 | Lee et al. | |
| 10,128,836 B1* | 11/2018 | Buttolo | H03K 3/02 |
| 2005/0210315 A1* | 9/2005 | Oda | G06F 21/552 714/6.1 |
| 2007/0253238 A1* | 11/2007 | Resta | G11C 11/2275 365/148 |
| 2009/0100238 A1* | 4/2009 | Adachi | G11C 7/24 711/163 |
| 2009/0187717 A1* | 7/2009 | Nasu | G06F 12/0802 711/141 |
| 2009/0201730 A1* | 8/2009 | Lueng | G11C 14/0018 365/185.08 |
| 2009/0240885 A1* | 9/2009 | Adachi | G06K 19/07732 711/115 |
| 2010/0037005 A1 | 2/2010 | Kim et al. | |
| 2011/0060872 A1 | 3/2011 | Tanaka | |
| 2011/0167208 A1* | 7/2011 | So | G06F 12/0246 711/103 |
| 2013/0241745 A1* | 9/2013 | Colvin, Jr. | A61B 5/076 340/870.02 |
| 2014/0089563 A1* | 3/2014 | Wu | G06F 11/1417 711/103 |
| 2016/0162356 A1* | 6/2016 | Singhai | G11C 29/765 714/766 |
| 2016/0335011 A1* | 11/2016 | Lee | G06F 11/1461 |
| 2017/0090762 A1* | 3/2017 | Ea | G11C 29/82 |
| 2017/0206036 A1* | 7/2017 | Pax | G11C 29/883 |
| 2018/0032275 A1* | 2/2018 | Pahwa | G11C 29/028 |
| 2018/0088818 A1* | 3/2018 | Sakurai | G06F 3/0619 |
| 2018/0089081 A1* | 3/2018 | Ramalingam | G06F 11/079 |
| 2018/0095698 A1* | 4/2018 | Liao | G06F 3/0644 |
| 2018/0102148 A1* | 4/2018 | Kim | G11C 8/18 |
| 2018/0165187 A1* | 6/2018 | Kim | G11C 16/08 |
| 2018/0173465 A1* | 6/2018 | Tanaka | G06F 13/4022 |
| 2019/0018597 A1* | 1/2019 | Zhang | G06F 3/0611 |
| 2019/0027214 A1* | 1/2019 | Yang | G11C 16/26 |
| 2019/0138443 A1* | 5/2019 | Thiruvengadam | G11C 16/20 |
| 2019/0146688 A1* | 5/2019 | Oh | G06F 3/0679 711/103 |
| 2019/0196733 A1* | 6/2019 | Lee | G11C 11/40618 |
| 2019/0236030 A1* | 8/2019 | Lim | G06F 3/0613 |
| 2019/0303284 A1* | 10/2019 | Trika | G06F 3/0679 |
| 2019/0303310 A1* | 10/2019 | Richter | G06F 3/061 |
| 2020/0026444 A1* | 1/2020 | Dai | G06F 3/0604 |
| 2020/0050930 A1* | 2/2020 | Pirim | G11C 13/0026 |
| 2020/0097208 A1* | 3/2020 | Ross | G06F 3/0655 |
| 2020/0097213 A1* | 3/2020 | Ross | G06F 3/0656 |
| 2020/0126625 A1* | 4/2020 | Park | G11C 7/109 |
| 2020/0183610 A1* | 6/2020 | Seetharaman | G06F 3/0616 |
| 2020/0234772 A1* | 7/2020 | Halperin | G11C 29/028 |
| 2020/0401518 A1* | 12/2020 | Park | G11C 7/1042 |
| 2021/0011657 A1* | 1/2021 | Sheperek | G06F 3/0604 |
| 2021/0026545 A1* | 1/2021 | Cheng | G06F 1/3275 |
| 2021/0026565 A1* | 1/2021 | Her | G11C 15/046 |
| 2021/0034251 A1* | 2/2021 | Choi | G11C 16/10 |
| 2021/0034509 A1* | 2/2021 | Choi | G06F 12/023 |
| 2021/0082510 A1* | 3/2021 | Yamada | G06F 3/0658 |

FOREIGN PATENT DOCUMENTS

| | | |
|---|---|---|
| JP | 5002844 A | 3/2009 |
| KR | 1942275 B1 | 1/2019 |

* cited by examiner

METHOD OF CONTROLLING INITIALIZATION OF NONVOLATILE MEMORY DEVICE AND MEMORY SYSTEM INCLUDING NONVOLATILE MEMORY DEVICE

CROSS-REFERENCE TO RELATED APPLICATION

This U.S. non-provisional application claims priority under 35 USC § 119 to Korean Patent Application No. 10-2019-0121430, filed on Oct. 1, 2019, in the Korean Intellectual Property Office (KIPO), the disclosure of which is incorporated by reference herein in its entirety.

BACKGROUND

1. Technical Field

Example embodiments relate generally to semiconductor integrated circuits. For example, at least some example embodiments relate to a method of controlling initialization of a nonvolatile memory device and/or a memory system including a nonvolatile memory device.

2. Discussion of the Related Art

A nonvolatile memory device such as a flash memory device, a resistive memory device, etc. may store data by programming each memory cell to have one of threshold voltage distributions or resistance distributions corresponding to different logic states. Initialization of the nonvolatile memory device may include a procedure of moving information data stored in the nonvolatile memory device to another memory component. Three-dimensional nonvolatile memory devices such as a vertical NAND flash memory device are developed to increase an integration degree of memory cells. As the integration degree and the memory capacity of the nonvolatile memory device are increased, a time for initializing the nonvolatile memory device may increase.

SUMMARY

Some example embodiments may provide a method of controlling initialization of a nonvolatile memory device, capable of performing initialization efficiently.

Some example embodiments may provide a memory system including a nonvolatile memory device, capable of performing initialization efficiently.

According to example embodiments, a method of controlling initialization of a first nonvolatile memory device included in a memory system, includes storing information data for initialization of the first nonvolatile memory device in the first nonvolatile memory device before assembling the memory system; moving the information data from the first nonvolatile memory device to a second nonvolatile memory device included in the memory system after assembling the memory system; and initializing the first nonvolatile memory device based on the information data stored in the second nonvolatile memory device.

According to example embodiments, a memory system includes a first nonvolatile memory device configured to store information data for initialization of the first nonvolatile memory device before assembling the first nonvolatile memory device in the memory system; a second nonvolatile memory device; and a controller configured to, move the information data from the first nonvolatile memory device to the second nonvolatile memory device after assembling the memory system, and initialize the first nonvolatile memory device based on the information data stored in the second nonvolatile memory device.

According to example embodiments, a method of controlling initialization of a NAND flash memory device included in a memory system, includes providing information data for initialization of the NAND flash memory device through a wafer test after the NAND flash memory device is integrated in a wafer and before the NAND flash memory device is cut from the wafer; storing the information data in the NAND flash memory device before assembling the memory system; moving the information data from the NAND flash memory device to a PRAM device included in the memory system after assembling the memory system; initializing the NAND flash memory device based on the information data stored in the PRAM device; and converting a memory region of the NAND flash memory device associated with storing the information data to a memory region storing user data after moving the information data from the NAND flash memory device to the PRAM device.

The method and the memory system according to example embodiments may efficiently reduce an initialization time of the first nonvolatile memory device by moving the information data from the first nonvolatile memory device to the second nonvolatile memory device having a relatively higher speed for a reading operation and using the information data read from the second nonvolatile memory device.

Further, the method and the memory system according to some example embodiments may efficiently utilize the memory space of the first nonvolatile memory device and reduce the cost of the system by converting the memory region storing the information data of the first nonvolatile memory device to the memory region storing the user data.

BRIEF DESCRIPTION OF THE DRAWINGS

Example embodiments of the present disclosure will be more clearly understood from the following detailed description taken in conjunction with the accompanying drawings.

DETAILED DESCRIPTION

Figure 1:
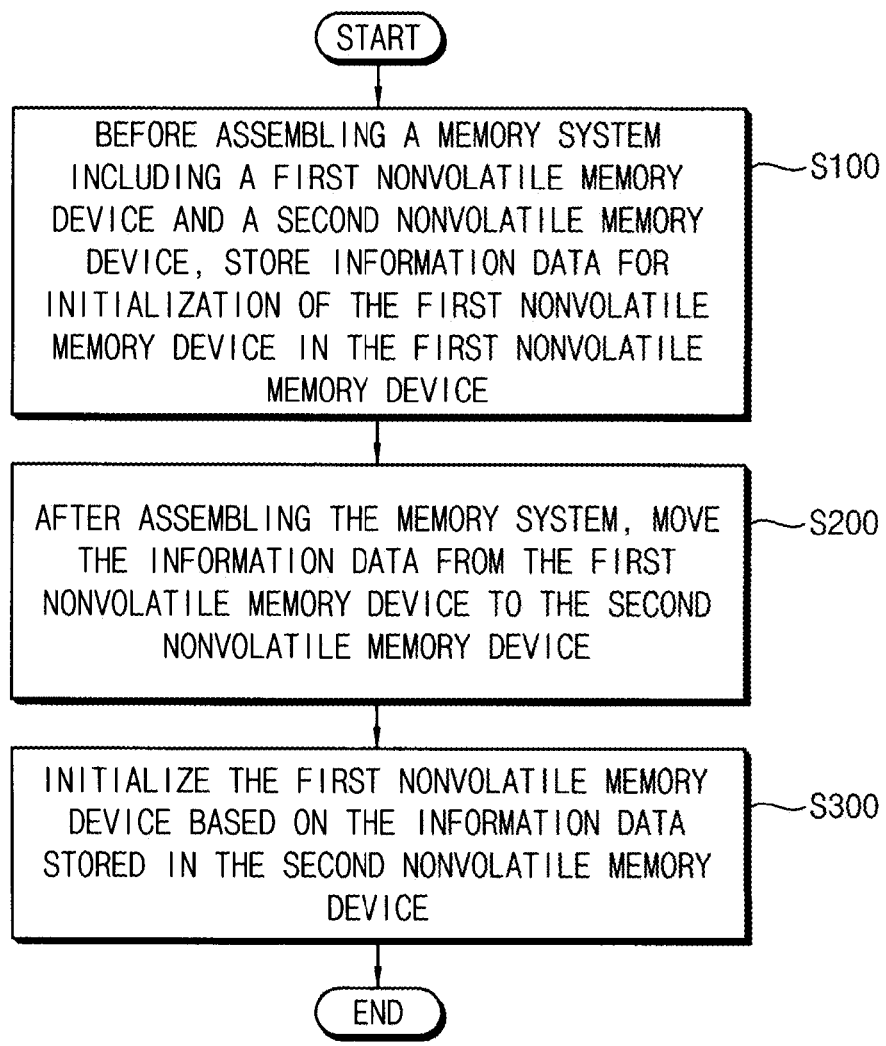
FIG. 1 is a flow chart illustrating a method of controlling initialization of a nonvolatile memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of controlling initialization of a nonvolatile memory device according to example embodiments.

Referring to FIG. 1, before assembling a memory system including a first nonvolatile memory device and a second nonvolatile memory device, in operation S100, information data for initialization of the first nonvolatile memory device may be stored in the first nonvolatile memory device.

After assembling the memory system, in operation S200, the information data may be moved from the first nonvolatile memory device to the second nonvolatile memory device.

In operation S300, the first nonvolatile memory device is initialized based on the information data stored in the second nonvolatile memory device.

A speed of a read operation of the second nonvolatile memory device may be higher than a speed of a read operation of the first nonvolatile memory device. In some example embodiments, the first nonvolatile memory device may be a NAND flash memory device as will be described below with reference to FIGS. 6 through 8 and the second nonvolatile memory device may be a phase change random access memory (PRAM) device as will be described below with reference to FIGS. 13 through 19.

As such, the method and the memory system according to example embodiments may efficiently reduce an initialization time of the first nonvolatile memory device by moving the information data from the first nonvolatile memory device to the second nonvolatile memory device having the rapid speed of the reading operation and using the information data read from the second nonvolatile memory device.

In some example embodiments, as will be described below with reference to FIG. 5, after moving the information data from the first nonvolatile memory device to the second nonvolatile memory device, a memory region storing the information data of the first nonvolatile memory device may be converted to a memory region storing user data.

As such, the method and the memory system according to example embodiments may efficiently utilize the memory space of the first nonvolatile memory device and reduce the cost of the system by converting the memory region storing the information data of the first nonvolatile memory device to the memory region storing the user data.

Figure 2:
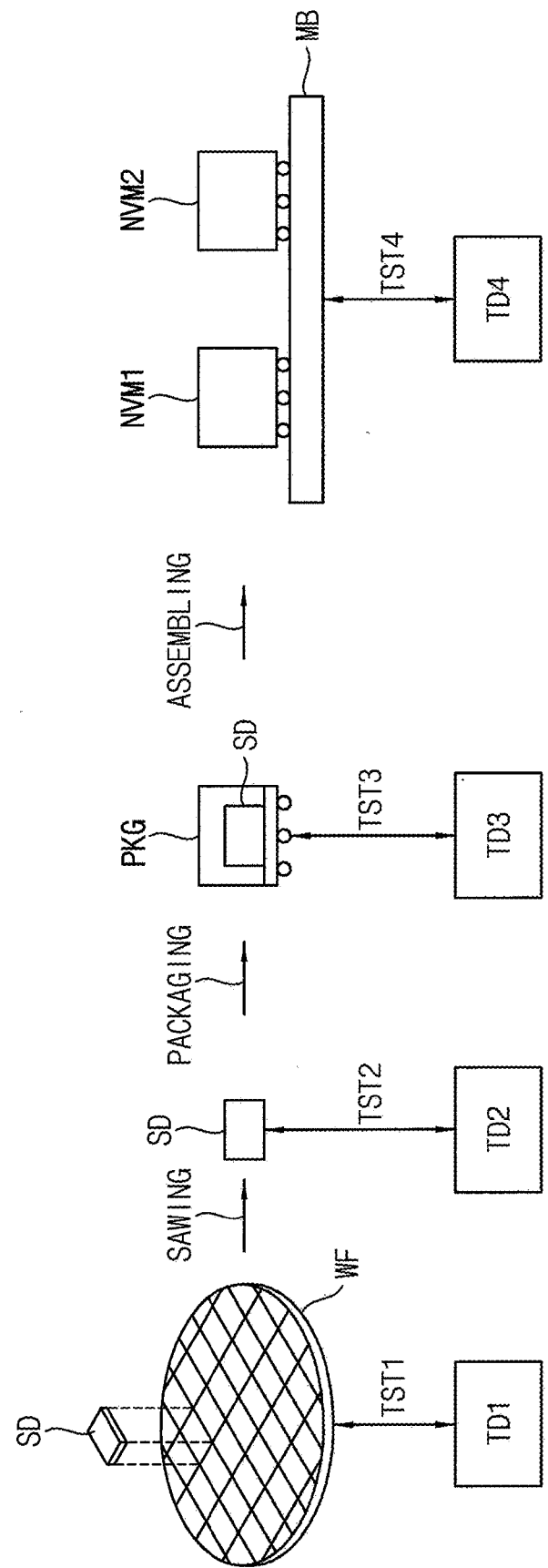
FIG. 2 is a diagram for describing tests according to a manufacturing process of a memory system.
Figure 3:
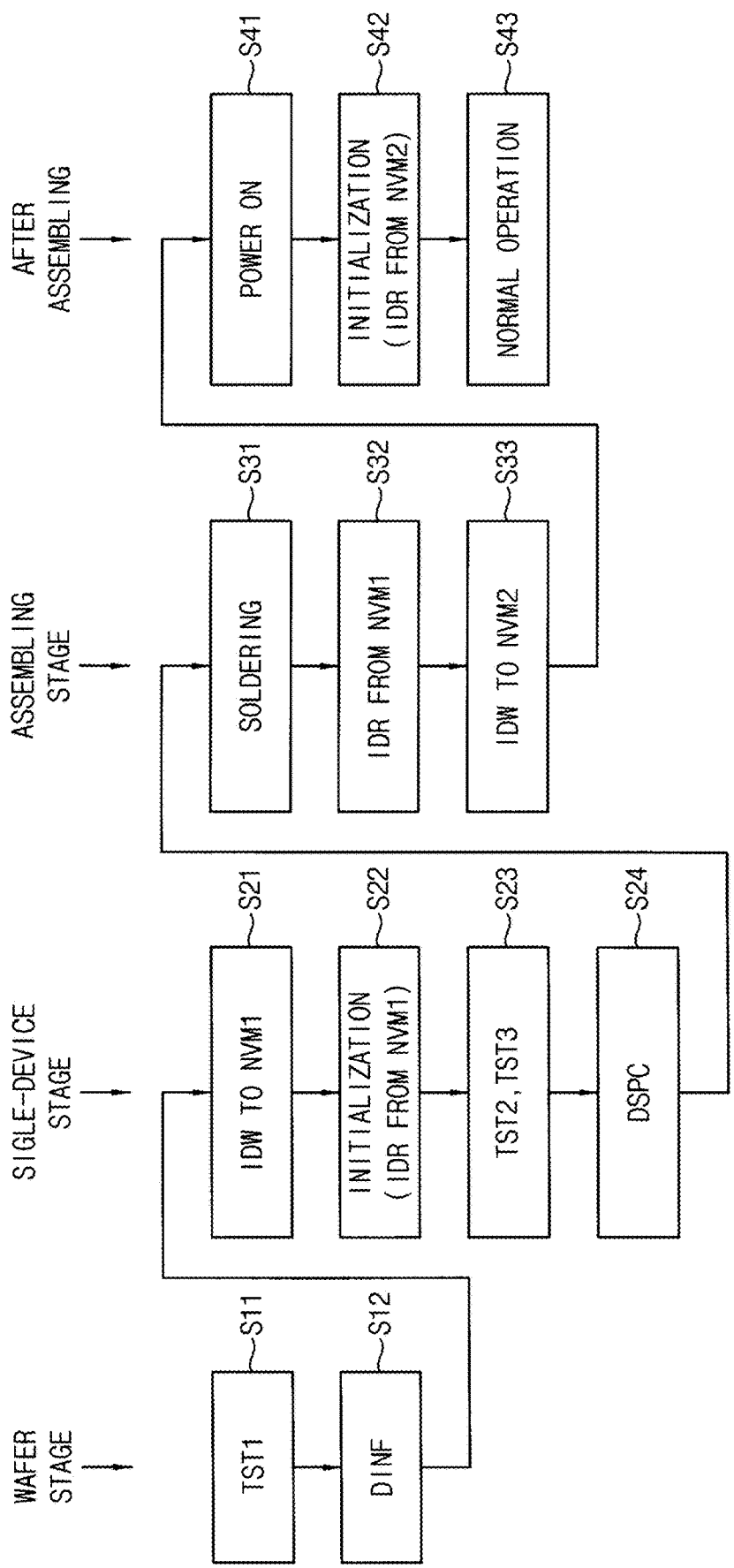
FIG. 3 is a diagram illustrating relationship between the tests of FIG. 2 and a method of controlling initialization of the nonvolatile memory device according to example embodiments.

FIG. 2 is a diagram for describing tests according to a manufacturing process of a memory system, and FIG. 3 is a diagram illustrating relationship between the tests of FIG. 2 and a method of controlling initialization of the nonvolatile memory device according to example embodiments.

Referring to FIGS. 2 and 3, a semiconductor wafer WF may include a plurality of semiconductor dies SD in which circuits corresponding to nonvolatile memory devices are integrated. Each semiconductor die SD may correspond to the above-described first nonvolatile memory device NVM1.

In a wafer stage before the semiconductor dies SD including the integrated circuits are cut from the wafer WF, in operation S11, a wafer test TST1 for estimating optimization of the semiconductor dies SD on the wafer WF may be performed using a tester device TD1. Through the wafer test TST1, in operation S12, information on core timing, DC regulators etc. may be obtained and the information data DINF for initialization of the first nonvolatile memory device NVM1 may be provided. As such, the information data DINF may be provided through the wafer test TST1 after the first nonvolatile memory device NVM1 was integrated in the wafer WF and before the first nonvolatile memory device NVM1 is cut from the wafer WF.

After that, each semiconductor die SD is cut from the wafer WF through a sawing process and a packaging process is performed to place the semiconductor die SD in a package PKG.

In a single-device stage, in operation S21, an information data write operation IDW may be performed to store the information data DINF in the first nonvolatile memory device NVM1, and, in operation S22, an information data read operation IDR may be performed to read the information data DINF from the first nonvolatile memory device NVM1 to initialize the first nonvolatile memory device NVM1 in the state of the single device. After the first nonvolatile memory device NVM1 is initialized, in operation S23, single-device tests TST2 and TST3 of the first nonvolatile memory device NVM1 may be performed using tester devices TD2 and TD3, and, in operation S24, special data DSPC for the operation of the first nonvolatile memory device NVM1 may be provided based on the single-device tests TST2 and TST3. The single-device tests may include the pre-package test TST2 and the post-package test TST3. For example, the special data DSPC may include bad block information of the first nonvolatile memory device NVM1.

In an assembling stage, in operation S31, the first nonvolatile memory device NVM1 and the second nonvolatile memory device NVM2 that are packaged as described above may be mounted on a mother board MB through, for example, a soldering process to assemble the memory system. After that, in operation S32, an information data read operation IDR may be performed to read the information data DINF from the first nonvolatile memory device NVM1 and, in operation S33, an information data write operation IDW may be performed to store the information data DINF in the second nonvolatile memory device NVM2. As such, after assembling the memory system, the information data DINF may be moved and stored from the first nonvolatile memory device NVM1 to the second nonvolatile memory device NVM2.

After assembling the memory system, a system test TST4 may be performed using a tester device TD4. When the memory system is powered on in operation S41, in operation S42, an information data read operation IDR may be performed to read the information data DINF from the second nonvolatile memory device NVM2 and initialize the first nonvolatile memory device NVM1 in the assembled state. After the first nonvolatile memory device NVM1 is initialized, in operation S43, a normal operation of the first nonvolatile memory device NVM1 may be performed. As such, the initialization time of the first nonvolatile memory device NVM1 may be reduced efficiently by moving the information data DINF from the first nonvolatile memory device NVM1 to the second nonvolatile memory device NVM2 having the rapid speed of the reading operation and using the information data DINF read from the second nonvolatile memory device NVM2 to initialize the first nonvolatile memory device NVM1.

Figure 4:
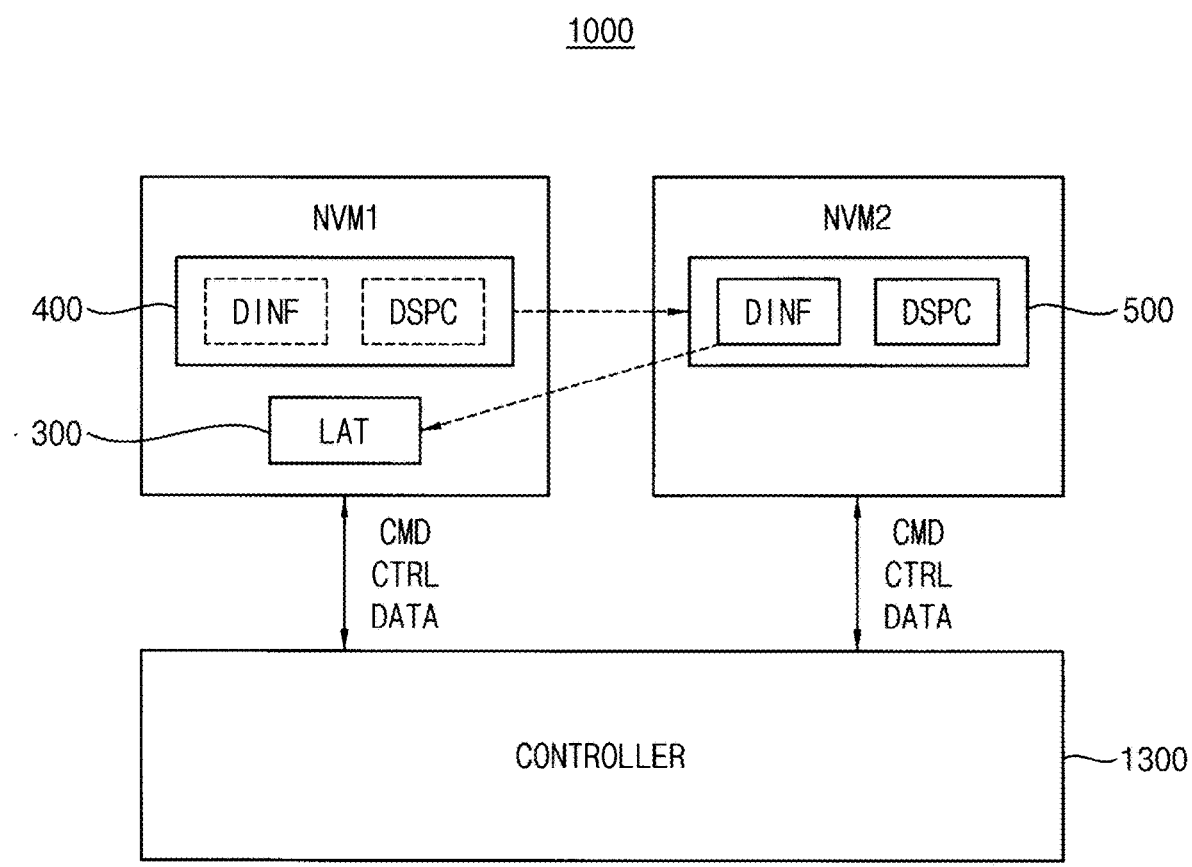
FIG. 4 is a block diagram illustrating a memory system according to example embodiments.

FIG. 4 is a block diagram illustrating a memory system according to example embodiments.

Referring to FIG. 4, a memory system 1000 includes a first nonvolatile memory device NVM1, a second nonvolatile memory device NVM2 and a controller 1300. The first nonvolatile memory device NVM1 may be a NAND flash memory device and may be used as main storage of the memory system 1000. The first nonvolatile memory device NVM1 may include a memory cell array 400 and an electric fuse circuit 300 such as a latch circuit LAT. The NAND flash memory device will be further described with reference to FIGS. 6 through 8. The first nonvolatile memory device NVM1 may receive a command CMD and control signals CTRL, and exchange data DATA with the controller 1300.

The second nonvolatile memory device NVM2 may be a phase change random access memory (PRAM) device and may be used as main storage, auxiliary storage, buffer memory, or cache memory of memory system 1000. The second nonvolatile memory device NVM2 may include a memory cell array 500. The PRAM device will be further described with reference to FIGS. 13 through 19. The second nonvolatile memory device NVM2 may receive a command CMD and control signals CTRL, and exchange data DATA with controller 1300.

The controller 1300 may control overall operations of the first nonvolatile memory device NVM1 and the second nonvolatile memory device NVM2. According to example embodiments, the controller 1300 may move the information data DINF and the special data DSPC from the first nonvolatile memory device NVM1 to the second nonvolatile memory device NVM2 after assembling the memory system 1000. The controller 1300 may initialize the first nonvolatile memory device NVM1 based on the information data DINF stored in the second nonvolatile memory device NVM2. The controller 1300 may set values of the electric fuse circuit 300 during the initialization procedure, and control the operation of the first nonvolatile memory device NVM1 based on the set values of the electric fuse circuit 300.

Figure 5:
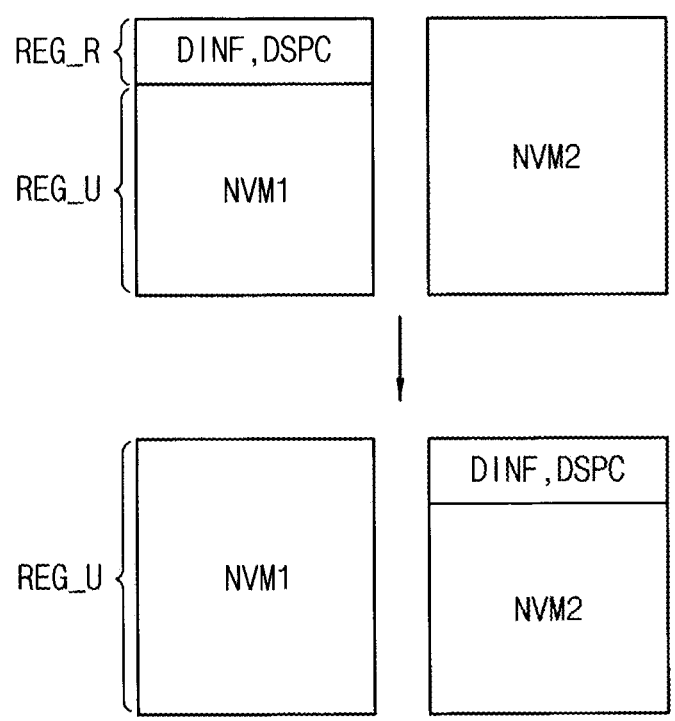
FIG. 5 is a diagram for describing cost reduction of a memory system according to example embodiments.

FIG. 5 is a diagram for describing cost reduction of a memory system according to example embodiments.

A top portion of FIG. 5 shows a state that the information data DINF and the special data DSPC are stored in the first nonvolatile memory device NVM1 before assembling the memory system, and a bottom portion of FIG. 5 shows a state that the information data DINF and the special data DSPC are moved and stored in the second nonvolatile memory device NVM2 after assembling the memory system.

As illustrated in FIG. 5, after moving the information data DINF and the special data DSPC to the second nonvolatile memory device NVM2, the memory region REG_R storing the information data DINF and the special data DSPC of the first nonvolatile memory device NVM1 may be converted to the memory region REG_U storing the user data. For example, when the first nonvolatile memory device NVM1 is a NAND flash memory device, the reserved memory region REG_R may be converted to the memory region REG_U for the user data by adding the physical addresses of the reserved region REG_R in a mapping table of meta data that are managed by a flash translation layer (FTL).

For example, in 512 Gb NAND flash memory device, the reserved memory region REG_R includes about 16 memory blocks to store the information data DINF and the special data DSPC with respect to 912 memory blocks. The memory space of the first nonvolatile memory device may be utilized efficiently and the cost of the system may be reduced by converting the memory region REG_R storing the information data DINF of the first nonvolatile memory device NVM1 to the memory region REG_U storing the user data.

As described above, the information data DINF are data for initialization of the NAND flash memory device that are determined through the test before assembling the memory system. The information data DINF may be set in the electric fuse circuit during a booting process or just after the booting process is completed. The information data DINF are differentiated from data such as meta data that are determined according to use of the NAND flash memory device. In addition, the information data DINF are differentiated from data that are provided from a host device to control the operation of the NAND flash memory device.

The information data DINF do not permit a single error and thus the information data DINF may be stored as a plurality of write information data WSD in a plurality of memory regions as will be described below with reference to FIG. 9. Even though the same information data DINF are stored in the plurality of memory regions, the read information data may be distorted and different from the write information data WSD due to deviation of a program operation, deviations of a read operation, degeneration of the memory cells, and so on. Accordingly, when the read information data from one memory region has uncorrectable errors, the read information data may be loaded from another memory region.

A copy scheme of the information data DINF is different depending on products. In general, the information data DINF may include plane replica data for correcting bitline defects and a string selection line (SSL) replica data for correcting SSL defects.

An initialization sequence or an IDR sequence may include "sensing" to read out the information data from the memory cells to a page buffer circuit, "dump-down" to verify validity of the data stored in the page buffer circuit and store valid information data in a buffer, and "following processes" to set operation conditions of the nonvolatile memory device based on the valid information data in the buffer. For example, the "following processes" may include setting of levels of operation voltages, a WOR scan to exclude failed columns from a pass/fail operation, and so on.

As the integration degree and the memory capacity of the NAND flash memory device are increased, the amount of the setting data or the information data DINF may increase and thus the initialization time will be increased. Particularly in the NAND flash products adopting a plane independent read (PIR) scheme or a plane independent core (PIC) scheme, a core operation is performed independently per plane and the information data are increased due to per-plane setting and the initialization time is further increased. A booting time of a product is affected directly by the initialization time and it is important to reduce the initialization time.

According to example embodiments, the information data are moved from the first nonvolatile memory device such as the NAND flash memory device to the second nonvolatile memory device such as the PRAM device having the rapid speed of the reading operation, the information data read from the second nonvolatile memory device is used to initialize the first nonvolatile memory device and thus the initialization time may be reduced efficiently.

Figure 6:
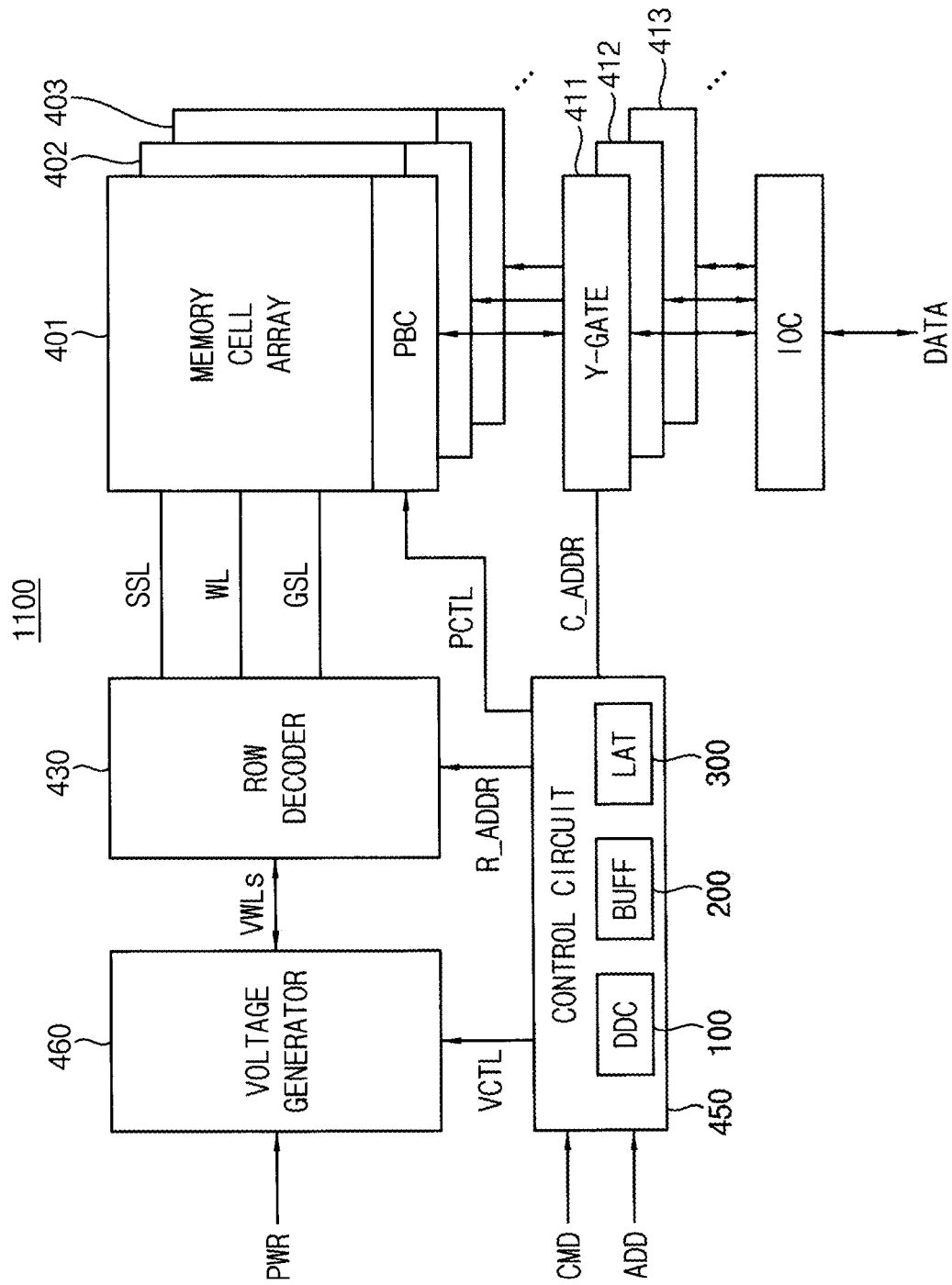
FIG. 6 is a block diagram illustrating a first nonvolatile memory device included in a memory system according to example embodiments.

FIG. 6 is a block diagram illustrating a first nonvolatile memory device included in a memory system according to example embodiments.

Referring to FIG. 6, a first nonvolatile memory device 1100 may include a plurality of memory planes 401, 402 and 403, each including a respective memory cell array and a page buffer circuit PBC. The first nonvolatile memory device 1100 may also include a row decoder 430, a plurality of column gates Y-GATE 411, 412 and 413, a data input-output circuit IOC, a control circuit 450, and a voltage generator 460.

Each memory cell array may be coupled to the row decoder 430 through a plurality of string selection lines SSL, a plurality of word lines WL, and a plurality of ground selection lines GSL. In addition, each memory cell array may be coupled to the respective page buffer circuit PBC through a plurality of bitlines (not shown). Each memory cell array may include a plurality of memory cells coupled to the plurality of word lines WL and the plurality of bitlines (described in more detail later). In some example embodiments, the memory cell array may be a three-dimensional memory cell array as will be described below with reference to FIG. 8, which may be formed on a substrate in a three-dimensional structure (or a vertical structure). In some example embodiments, each memory cell array may include a plurality of NAND strings or a plurality of cell strings that are vertically oriented such that at least one memory cell is located over another memory cell.

The control circuit 450 may receive a command (signal) CMD and an address (signal) ADD from the controller 1300 in FIG. 4 and control erasing, programming, writing, and/or reading operations of the first nonvolatile memory device 1100 based on the command signal CMD and the address signal ADD. Based on the command signal CMD, the control circuit 450 may generate the control signals VCTL, which are used for controlling the voltage generator 460, and may generate the page buffer control signal PCTL for controlling the page buffer circuit PBC. Based on the address signal ADD, the control circuit 450 may generate the row address R_ADDR and the column address C_ADDR. The control circuit 450 may provide the row address R_ADDR to the row decoder 430 and provide the column address C_ADDR to the column gates 411, 412 and 413. The row decoder 430 may be coupled to the memory cell array through the plurality of string selection lines SSL, the plurality of word lines WL, and the plurality of ground selection lines GSL.

During the program operation or the read operation, the row decoder 430 may determine that one of the word lines WL is a selected word line and determine that the rest of the word lines WL except for the selected word line are unselected word lines based on the row address R_ADDR. In addition, during the program operation or the read operation, the row decoder 430 may determine that one of the string selection lines SSL is a selected string selection line and determine that the rest of the string selection lines SSL except for the selected string selection line are unselected string selection lines based on the row address R_ADDR.

The voltage generator 460 may generate word line voltages VWLs, which may be required for the operation of the memory cell array of the nonvolatile memory device 30, based on the control signals VCTL. The voltage generator 460 may receive the power from the memory controller 20. The word line voltages VWLs may be applied to the word lines WL through the row decoder 430.

Each page buffer circuit PBC may be coupled to the memory cell array through the bitlines. The page buffer circuit PBC may include a plurality of page buffers. The page buffer circuit PBC may temporarily store data to be programmed in a selected page or data read out from the selected page of the memory cell arrays.

Each of the data input-output circuit IOC may be coupled to the corresponding page buffer circuit PBC through data lines. During the program operation, the data input-output circuit IOC may receive program data DATA received from the controller 1300 in FIG. 4 and provide the program data DATA to the page buffer circuit PBC based on the column address C_ADDR received from the control circuit 450. During the read operation, the data input-output circuit may provide read data DATA, having been read from the memory cell array and stored in the page buffer circuit PBC, to the controller 1300 based on the column address C_ADDR received from the control circuit 450.

The control circuit 450 may include a dump-down circuit DDC 100, a buffer BUFF 200 and an electric fuse circuit 300. The dump-down circuit 100 may be configured to perform the method of controlling initialization of a nonvolatile memory device as described with reference to FIG. 1. The buffer memory 200 may be implemented with a volatile memory to store data required by the first nonvolatile memory device 1100. During initialization of the first nonvolatile memory device 1100, the values of the electric fuse circuit 300 may be set based on the information data DINF.

Figure 7:
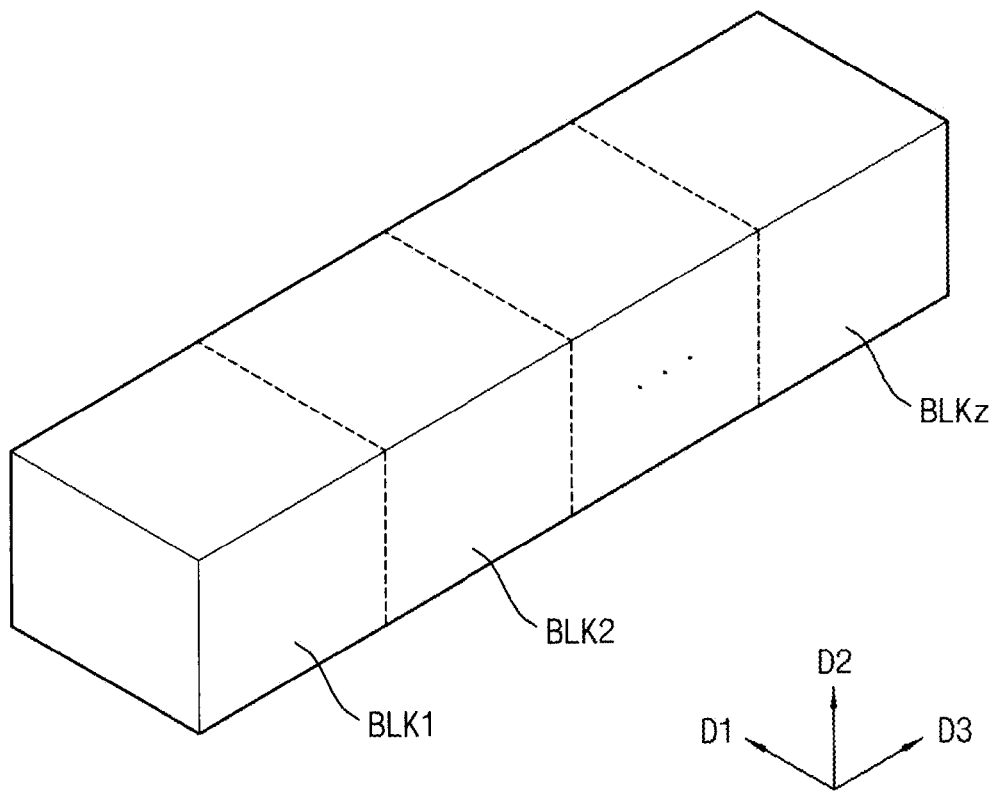
FIG. 7 is a block diagram illustrating an example of a memory cell array included in the first nonvolatile memory device of FIG. 6.
Figure 8:
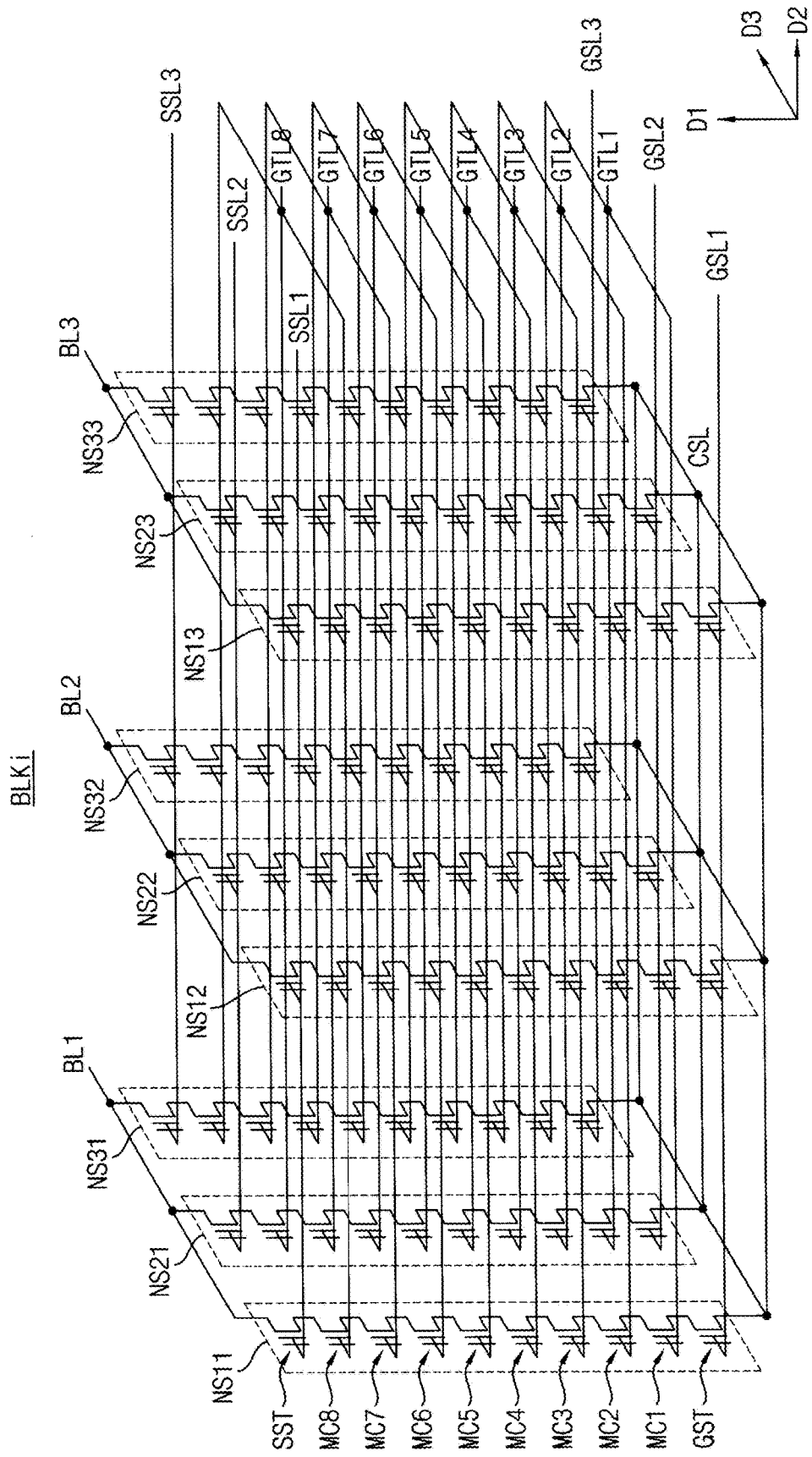
FIG. 8 is a circuit diagram illustrating an equivalent circuit of a memory block in FIG. 7.

FIG. 7 is a block diagram illustrating an example of a memory cell array included in the first nonvolatile memory device of FIG. 6, and FIG. 8 is a circuit diagram illustrating an equivalent circuit of a memory block in FIG. 7.

As illustrated in FIG. 7, the memory cell array or the memory plane 401 may include a plurality of memory blocks BLK1 to BLKz. The memory blocks BLK1 to BLKz are selected by the row decoder 430 in FIG. 6. For example, the row decoder 430 may select a particular memory block BLK corresponding to a block address among the memory blocks BLK1 to BLKz.

The memory block BLKi of FIG. 8 may be formed on a substrate in a three-dimensional structure (or a vertical structure). For example, a plurality of NAND strings or cell strings included in the memory block BLKi may be formed in a first direction D1 perpendicular to a second direction D2 and a third direction D3, that is, perpendicular to the upper surface of the substrate. Referring to FIG. 8, the memory block BLKi includes NAND strings NS11 to NS33 coupled between bitlines BL, BL2 and BL3 and a common source line CSL. Each of the NAND strings NS11 to NS33 includes a string selection transistor SST, a plurality of memory cells MC1 to MC8, and a ground selection transistor GST. In FIG. 8, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to the plurality of gate lines GTL1 to GTL8, respectively. The gate lines GTL1 to GTL8 may be wordlines and some of the gate lines GTL1 to GTL8 may be dummy wordlines. Each ground selection transistor GST may be connected to a corresponding ground selection line (one of GSL1 to GSL3). Each string selection transistor SST may be connected to a corresponding bitline (e.g., one of BL, BL2 and BL3), and each ground selection transistor GST may be connected to the common source line CSL.

Wordlines (e.g., WL1) having the same height (i.e., level) may be commonly connected, and the ground selection lines GSL1 to GSL3 and the string selection lines SSL1 to SSL3 may be separated. In FIG. 8, the memory block BLKi is illustrated to be coupled to eight gate lines GTL1 to GTL8 and three bitlines BL to BL3. However, example embodiments are not limited thereto.

Figure 9:
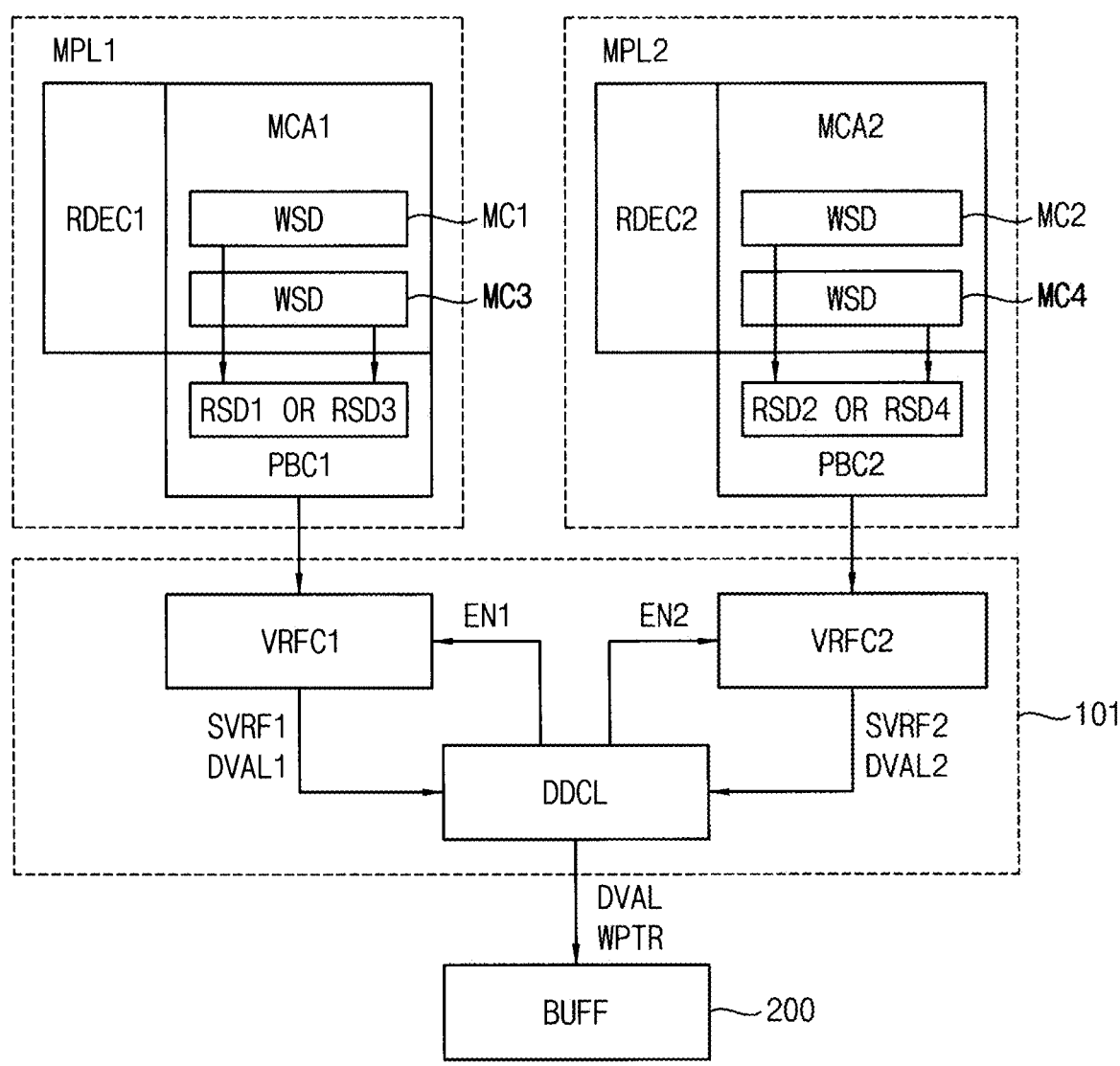
FIG. 9 is a diagram illustrating a first nonvolatile memory device included in a memory system according to example embodiments.

FIG. 9 is a diagram illustrating a first nonvolatile memory device included in a memory system according to example embodiments. FIG. 9 illustrates one components associated with initialization and the descriptions repeated with FIGS. 6, 7 and 8 are omitted.

Referring to FIG. 9, a first nonvolatile memory device 1101 may include a first memory plane MPL1, a second memory plane MPL2, a dump-down circuit 101 and a buffer 200. The first nonvolatile memory device 1101 may correspond to the first non-volatile memory device 1100 of FIG. 6 illustrating details of the dump-down circuit 100 and memory planes 401-403.

The data may be stored in or read from the first memory plane MPL1 and the second memory plane MPL2 under control of the control circuit 450 in FIG. 6. Each of the first memory plane MPL1 and the second memory plane MPL2 may be divided into a region for storing write information data WSD and a region for storing user data.

The first memory plane MPL1 may include a first memory cell array MCA1, a first row decoder RDEC1 and a first page buffer circuit PBC1. In the write operation, the first row decoder RDEC1 selects one wordline of the first memory cell array MCA1. The first page buffer circuit PBC1 transfers the data to the first memory cell array MCA1 through bitlines to store the data in the memory cells connected to the selected wordline. In the read operation, the first row decoder RDEC1 selects one wordline of the first memory cell array MCA1 and the first page buffer circuit PBC1 senses and stores the data stored in the memory cells connected to the selected wordline.

The second memory plane MPL2 may include a second memory cell array MCA2, a second row decoder RDEC2 and a second page buffer circuit PBC2. In the write operation, the second row decoder RDEC2 selects one wordline of the second memory cell array MCA2. The second page buffer circuit PBC2 transfers the data to the second memory cell array MCA2 through bitlines to store the data in the memory cells connected to the selected wordline. In the read operation, the second row decoder RDEC2 selects one wordline of the second memory cell array MCA2 and the second page buffer circuit PBC2 senses and stores the data stored in the memory cells connected to the selected wordline.

In this way, the write information data WSD may be stored in first memory cells MCi of the first memory plane MPL1 and second memory cells MC2 of the second memory plane MPL2. In addition, the write information data WSD may be stored in third memory cells MC3 of the first memory plane MPL1 and fourth memory cells MC4 of the second memory plane MPL2. A first sensing operation may be performed to sense the write information data WSD stored in the first memory cells MC1 and store first read information data RSD1 in the first page buffer circuit PBC1, and a second sensing operation may be performed to sense the write information data WSD stored in the second memory cells MC2 and store second read information data RSD2 in the second page buffer circuit PBC2. The first sensing operation and the second sensing operation may be performed simultaneously or sequentially.

When power is supplied to a system including the first nonvolatile memory device 1101, an initialization operation of the first nonvolatile memory device 1101 may be performed. The control circuit 450 in FIG. 6 may receive a power-on signal and perform the first sensing operation and the second sensing operation in response to the power-on signal to store the first read information data RSD1 and the second read information data RSD2 in the first page buffer circuit PBC1 and the second page buffer circuit PBC2, respectively.

Even though FIG. 9 illustrates the two memory planes for convenience of illustration and description, the first nonvolatile memory device 1101 may include three or more memory planes.

The dump-down circuit 101 may include a first verification circuit VRFC1, a second verification circuit VRFC2 and a dump-down control logic DDCL.

The first verification circuit VRFC1 is connected to the first page buffer circuit PBC1. The first verification circuit VRF1 may verify validity of the first read information data RSD1 to provide a first verification signal SVRF1 and first valid data DVAL1. The second verification circuit VRFC2 is connected to the second page buffer circuit PBC2. The second verification circuit VRFC2 may verify validity of the second read information data RSD2 to provide a second verification signal SVRF2 and second valid data DVAL2.

The dump-down control logic DDCL may determine valid data DVAL as one of the first read information data RSD1 and the second read information data RSD2 based on a validity verification result of the first read information data RSD1 and a validity verification result of the second read information data RSD2. The validity verification result of the first read information data RSD1 and the validity verification result of the second read information data RSD2 may be represented by logic levels of the first verification signal SVRF1 and the second verification signal SVRF2, respectively. The valid data DVAL may correspond to one of the first valid data DVAL1 and the second valid data DVAL2. Also the dump-down control logic DDCL may provide a write pointer WPTR or a write address indicating a position of the buffer 200 corresponding to the valid data DVAL presently provided to the buffer 200.

The dump-down control logic DDCL may generate a first enable signal EN and a second enable signal EN2 based on the first verification signal SVRF1 and the second verification signal SVRF2. The first verification circuit VRFC1 may be enabled in response to activation of the first enable signal EN1 and the second verification circuit VRFC2 may be enabled in response to activation of the second enable signal EN2.

If the dump-down operation based on the first read information data RSD1 and the second read information data RSD2 is determined as a failure, a third sensing operation may be performed to sense the write information data WSD stored in the third memory cells MC3 and store a third read information data RSD3 in the first page buffer circuit PBC1, and a fourth sensing operation may be performed to sense the write information data WSD stored in the fourth memory cells MC4 and store a fourth read information data RSD4 in the second page buffer circuit PBC2.

As such, the first and second read information data RSD1 and RSD2 in the first and second page buffer circuits PBC1 and PBC2 may be replaced with the third and fourth read information data RSD3 and RSD4, and the above-described dump-down operation may be performed based on the third and fourth read information data RSD3 and RSD4.

Figure 10:
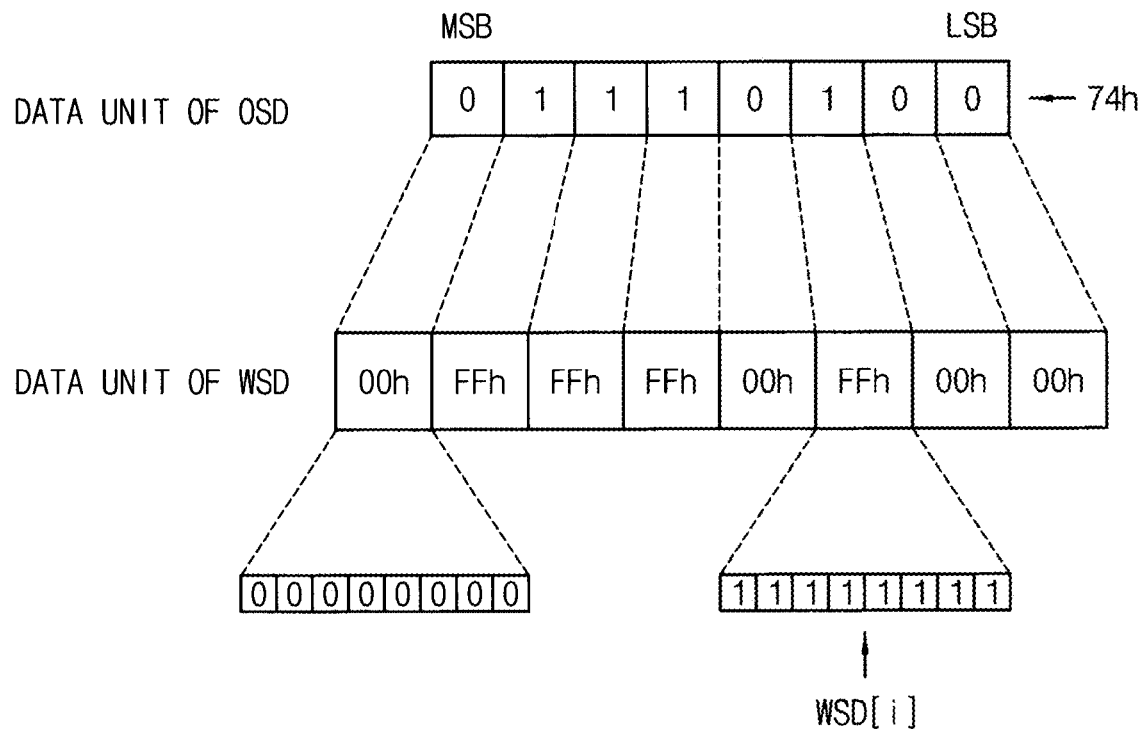
FIGS. 10, 11 and 12 are diagrams for describing example embodiments of a verification operation applicable to a method of controlling initialization of a nonvolatile memory device according to example embodiments.
Figure 11:
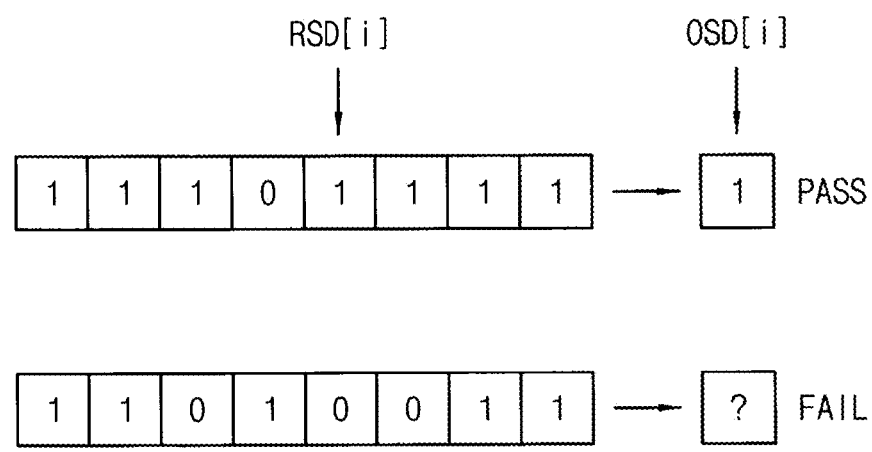
Figure 12:
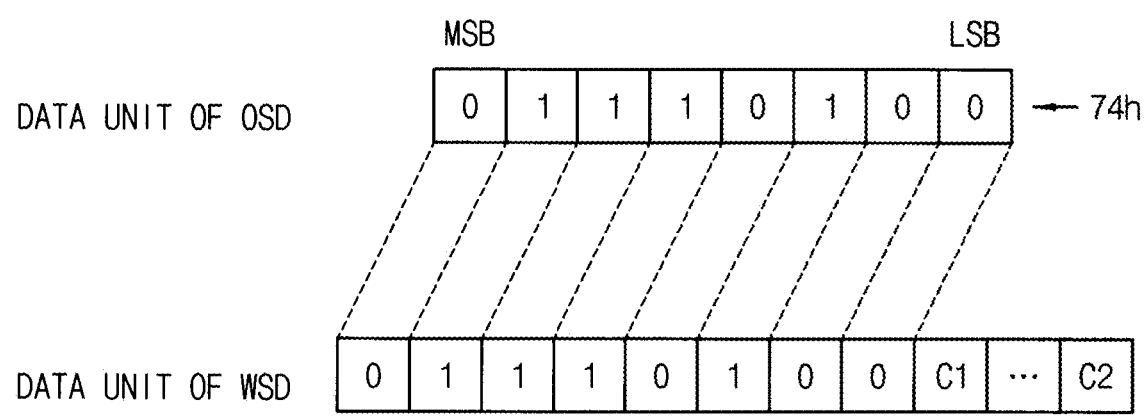

FIGS. 10, 11 and 12 are diagrams for describing example embodiments of a verification operation applicable to a method of controlling initialization of a nonvolatile memory device according to example embodiments.

FIGS. 10, 11 and 12 illustrate only one data unit of original information data OSD and write information data WSD for convenience of illustration and description. It would be understood that the original information data OSD and the write information data WSD may include a plurality of data units.

In the initialization sequence of the nonvolatile memory device, the information data stored in the memory cells is read out, verified and stored in the buffer. The column repair information is reflected in the WOR scan stage as described above, and the column defects have to be overcome by another scheme during the dump-down operation. To overcome the column defects, the write information data WSD may be obtained by copying each bit of the original information data OSD into a plurality of replica bits, and the write information data WSD having the replica bits may be stored in the nonvolatile memory device. In this case, each of the first verification circuit VRFC1 and the second verification circuit VRFC2 in FIG. 9 may include a majority voter circuit configured to determine whether a number of bits having an equal value among the plurality of replica bits corresponding to each bit of the original information data OSD is equal to or greater than a reference number.

For example, as illustrated in FIG. 10, each bit of the original information data OSD (e.g., of 8 bits of OSD shown in the example of FIG. 10) may be copied and extended to eight replica bits WSD[i] to form the write information data WSD. The WSD is written, and then read as the RSD shown in FIG. 11. The eights bits corresponding to each bit RSD[i] of the read information data RSD may be compared with the reference number. For example, if the reference number is set to be six, each bit RSD[i] may be determined as being valid (PASS) when six or more bits among the eight replica bits coincide, and each bit RSD[i] may be determined as being invalid (FAIL) when the five or fewer bits among the eight replica bits coincide. For example, assuming that replica bits of FFh shown in FIG. 10 is written as the WSD and then read as the RSD[i] shown in FIG. 11, the top data shows a valid (PASS) RSD[i] since only one bit is a zero 0. The bottom data shows an invalid (FAIL) RSD[i] since three bits are zero 0. In other words, in the top data, it may be determined that the OSD[i] was 1, whereas in the bottom data it cannot be determined that the OSD[i] was 1.

As another example of the verification operation, FIG. 12 illustrates an example embodiment in which parity bits C1~Ck of a cyclic redundancy check (CRC) scheme are used. The CRC scheme is known, and the detailed description thereof is omitted for conciseness. In this case, each of the first verification circuit VRFC1 and the second verification circuit VRFC2 may verify validity of the first read information data RSD1 and the second read information data RSD2 using the CRC parity bits.

Figure 13:
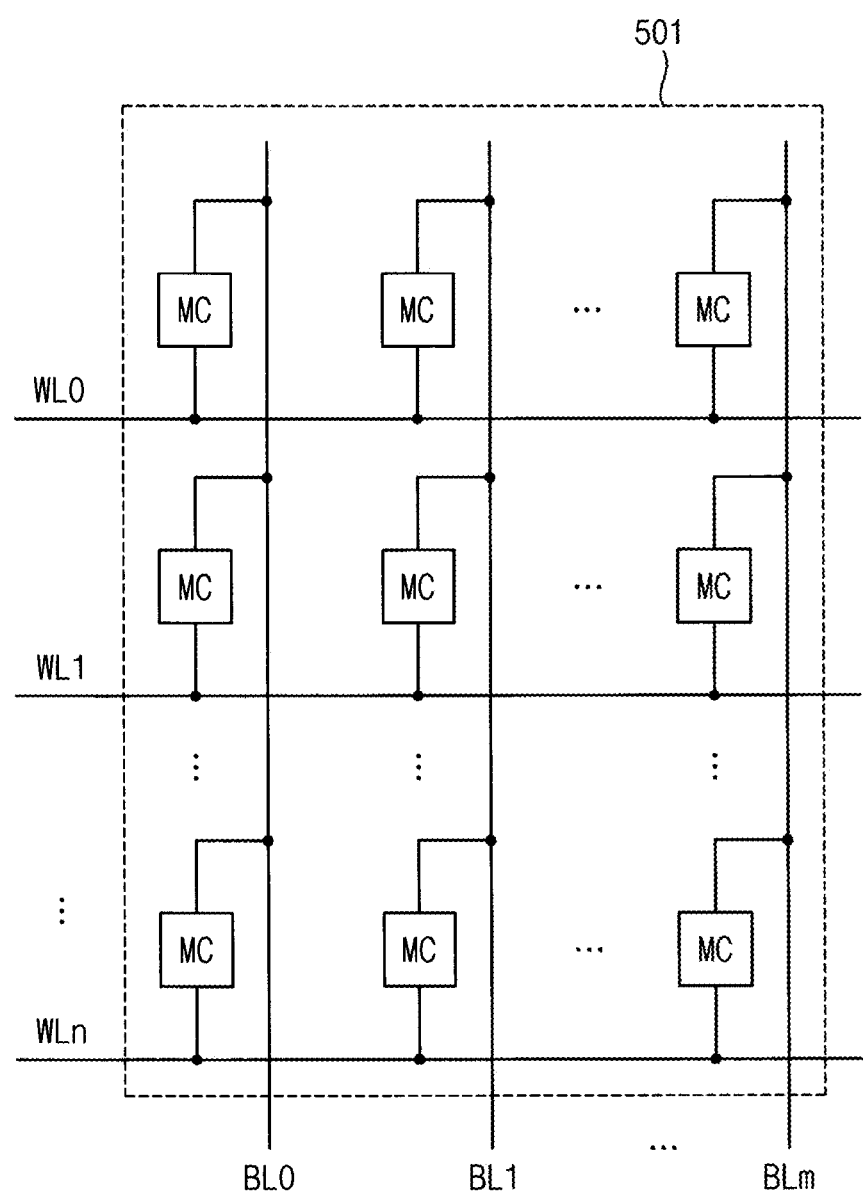
FIG. 13 is a diagram illustrating an example embodiment of a resistive cell array of a second nonvolatile memory device included in a memory system according to example embodiments.

FIG. 13 is a diagram illustrating an example embodiment of a resistive cell array of a second nonvolatile memory device included in a memory system according to example embodiments.

Referring to FIG. 13, a memory cell array 501 includes a plurality of memory cells MC, which are disposed at the positions crossed by wordlines WL0~WLn and bitlines BL0~BLm. Each memory cell MC may include a resistive element as will be described below with reference to FIGS. 14 and 15. When the corresponding wordline is selected and enabled by the row selection circuit, the program operation or the read operation may be performed with respect to the resistive memory cells connected to the selected wordline. Each memory cell MC is coupled between one of the wordlines WL0~WLn and one of the bitlines BL0~BLm. In this case, the bias voltage applied over each memory cell MC may be a voltage difference between the voltages applied to the bitline and the wordline.

In some example embodiments, the memory cell MC may be implemented with a phase-change random access memory (PRAM) cell using phase-change materials, a resistance random access memory (RRAM) cell using complex metal oxide of variable resistance, a ferroelectrics random access memory (FRAM) cell using ferroelectric materials and a magneto-resistive random access memory (MRAM) cell using ferromagnetic materials. Such resistive materials of the resistive element may have the resistance value depending on the magnitude and/or the direction of the applied current or voltage and have characteristics of non-volatility of maintaining the resistance value even though power is off.

Figure 14:
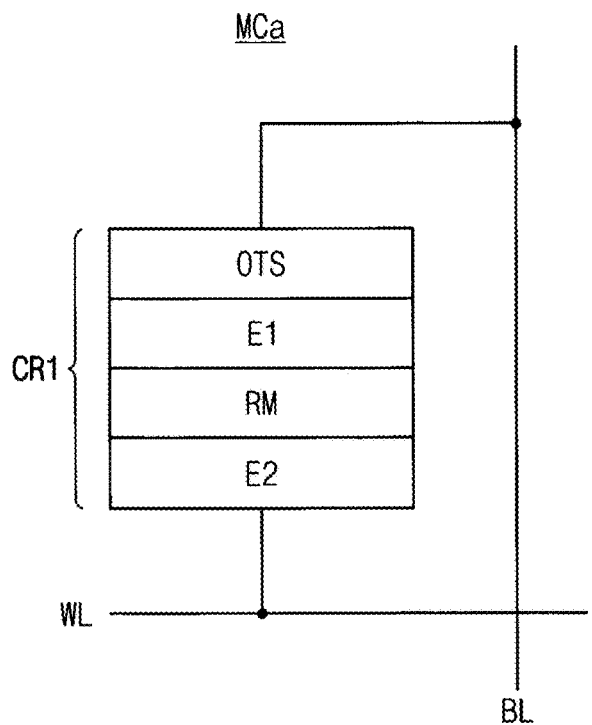
FIGS. 14 and 15 are diagrams illustrating example embodiments of a resistive memory cell included in the second nonvolatile memory device of FIG. 13.
Figure 15:
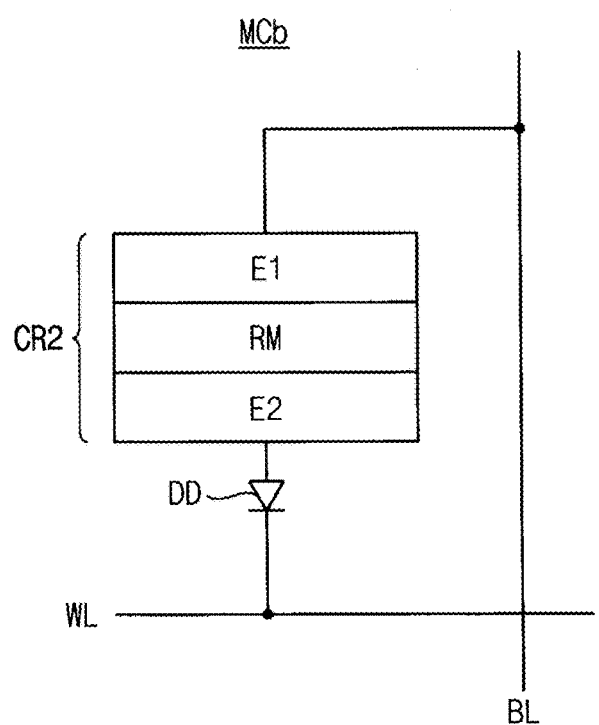

FIGS. 14 and 15 are diagrams illustrating example embodiments of a resistive memory cell included in the second nonvolatile memory device of FIG. 13.

Referring to FIG. 14, a resistive memory cell MCa may include a resistive element CR1 connected between a wordline WL and a bitline BL. The ends of the resistive element CR1 are respectively coupled to the wordline WL and the bitline BL to selectively enable writing data to and/or reading data from the resistive memory cell MCa.

In some example embodiments, a resistive element CR1 may include an ovonic threshold switch (OTS) that selectively isolates the resistive memory cell MCa from conducting current; a first electrode E1; a resistive material RM to maintain a state representing a particular stored data value; and/or a second electrode E2. In some example embodiments, the resistive element CR1 may be formed by a series of layers between the wordline WL and the bitline BL or in other geometric relationships. The resistive material or the phase change material RM may be a material having electrical properties such as resistance, capacitance, or other electrical characteristics, that may be changed through the application of energy such as, for example, heat, light, voltage potential, or electrical current. A large variety of phase change material types with widely differing properties may be selected for the resistive material RM. In some example embodiments, the resistive material RM may include a chalcogenide material.

In some example embodiments, a resistive material RM may remain stable locally in one of two phases or in a combination of the two phases over an operating temperature range. The resistive material RM may exhibit different electrical properties in the amorphous phase than in the crystalline phase. In various example embodiments, the resistive material RM may include either or both of two properties: (a) it may exist locally in an amorphous phase without crystallization for a prolonged period of time, such as for several years, at room temperature, and/or (b) the amorphous phase may crystallize rapidly if temperature is raised.

In some example embodiments, characteristics of the resistive material RM may depend on the type of material and/or the phases of the material that are used. In some example embodiments, the resistive material RM may be put into a high resistance state or a low resistance state. In some example embodiments, the high resistance state may be referred to as the reset state and the low resistance state may be referred to as the set state; in other example embodiments, the terminology may be reversed. The second nonvolatile memory device NVM2 according to example embodiments may not be limited to the particular resistive material RM.

The OTS may be used to access the resistive material RM during programming or reading of the resistive material RM. The OTS may include an ovonic material to operate as a switch that is either off or on depending on a voltage applied across the ovonic material. The off state may be a substantially electrically nonconductive state and the on state may be a substantially conductive state.

Referring to FIG. 15, a resistive memory cell MCb may include a resistive element CR2 and a diode DD connected in series between a wordline WL and a bitline BL. The resistive memory cell MCb of FIG. 15 is substantially the same as the resistive memory cell MCa of FIG. 14, except that the OTS for the switching operation is replaced with the diode DD, and the repeated descriptions are omitted.

Figure 16:
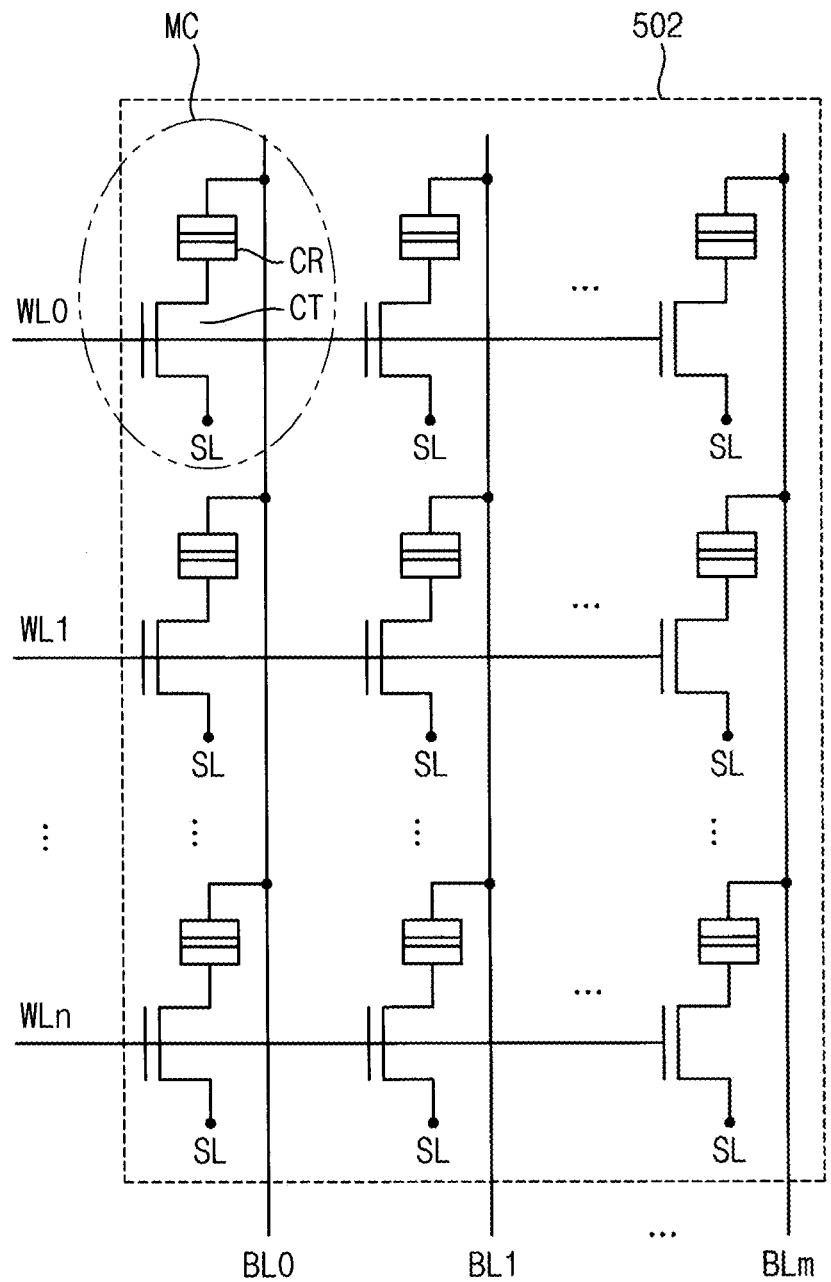
FIG. 16 is a diagram illustrating an example embodiment of a resistive cell array of a second nonvolatile memory device included in a memory system according to example embodiments.

FIG. 16 is a diagram illustrating an example embodiment of a resistive cell array of a second nonvolatile memory device included in a memory system according to example embodiments. Hereinafter, the descriptions repeated with FIG. 13 are omitted.

Referring to FIG. 16, a memory cell array 502 includes a plurality of memory cells MC, which are disposed at the positions crossed by wordlines WL0~WLn and bitlines BL0~BLm.

Each memory cell MC may include a cell transistor CT and a resistive element CR. In this case, the bias voltage applied over each memory cell MC may be a voltage difference between the voltages applied to the bitline and the source line. The plurality of memory cells MC may be coupled to the common source line SL. In some example embodiments, the memory cell array 502 may be partitioned into at least two cell regions and the cell regions may be coupled to the different source lines.

Figure 17:
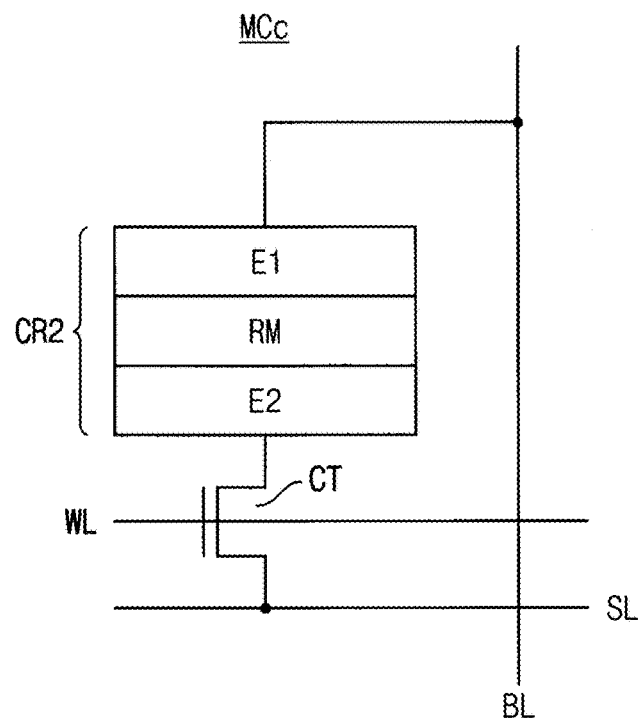
FIGS. 17 and 18 are diagrams illustrating example embodiments of a resistive memory cell included in the resistive cell array of FIG. 16.
Figure 18:
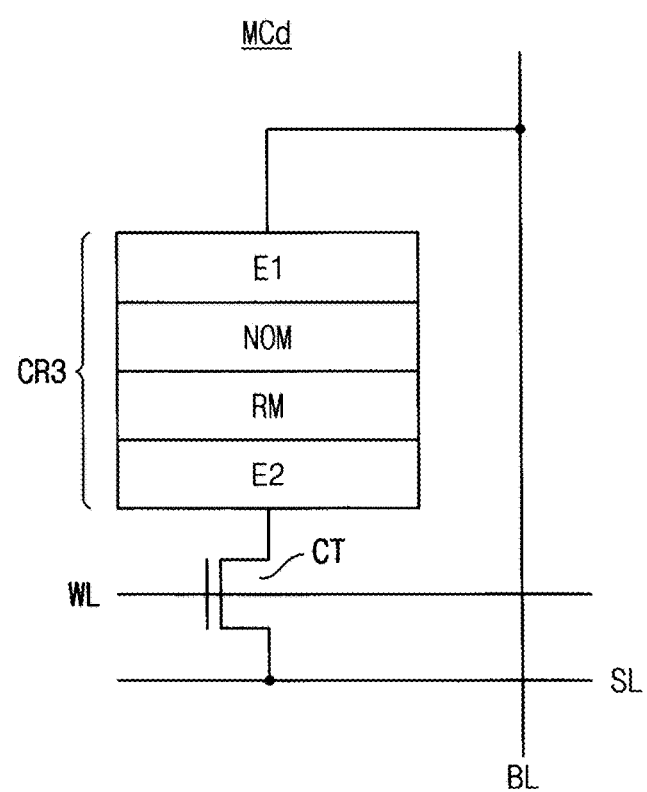

FIGS. 17 and 18 are diagrams illustrating example embodiments of a resistive memory cell included in the resistive cell array of FIG. 16.

Referring to FIG. 17, a resistive memory cell MCc may include a resistive material RM2 and a cell transistor CT connected between a bitline BL and a source line SL. The cell transistor CT is selectively turned on in response to a voltage applied to the wordline WL. If the cell transistor CT is turned on, a bias voltage corresponding to a voltage difference between the bitline BL and the source line SL may be applied to the resistive material RM2. The resistive element CR2 of FIG. 17 is substantially the same as that of FIG. 15, and the repeated descriptions are omitted.

Referring to FIG. 18, a resistive memory cell MCd may include a resistive material RM3 and a cell transistor CT connected between a bitline BL and a source line SL. The cell transistor CT is selectively turned on in response to a voltage applied to the wordline WL. If the cell transistor CT is turned on, a bias voltage corresponding to a voltage difference between the bitline BL and the source line SL may be applied to the resistive material RM3. The resistive element CR3 may include a first electrode E1, a second electrode E2, a non-ohmic material (NOM), and resistive material (RM) between the electrodes E1 and E2. In this case, the set state and the reset state may be programmed or written by applying opposite voltages to the electrodes E1 and E2 and/or based on a direction of induced current through the electrodes E1 and E2. In other words, the set state and the reset state may be determined according to polarity of the applied voltage and/or a direction of an induced current.

Figure 19:
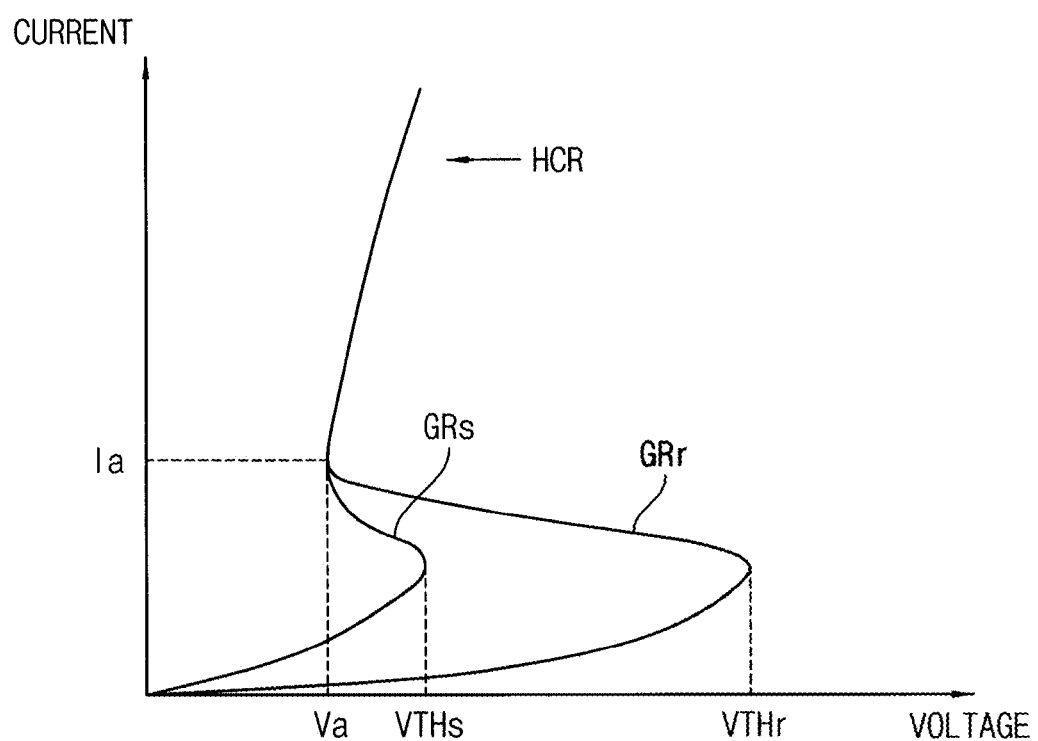
FIG. 19 is a diagram illustrating relationship between a current and a voltage of a resistive memory cell.

FIG. 19 is a diagram illustrating relationship between a current and a voltage of a resistive memory cell.

In FIG. 19, a curve GRs indicates a cell current with respect to a bias voltage applied over a resistive memory cell MC when a resistive material in the resistive memory cell is in a set state, and a curve GRr indicates a cell current with respect to the bias voltage applied over the resistive memory cell MC when the resistive material in the resistive memory cell is in a reset state.

In the example of FIG. 19, a set threshold voltage VTHs of the set state corresponds to an inflection point in curve GRs, where the resistive memory cell MC in the set state begins to exhibit changes in the cell current with a magnitude that is greater than the magnitude of changes in the threshold current, Ia, for small changes in cell voltage. For example, in a low voltage or low electric field mode where the bias voltage applied across the resistive memory cell MC is less than the set threshold voltage VTHs, the resistive memory cell MC may be in an off state that exhibits lower conductivity and/or higher resistance than in an on state. The resistive memory cell MC may remain effectively nonconductive until a voltage at least equal to about the set threshold voltage VTHs is applied that may switch the resistive memory cell MC to an on state that exhibits higher conductivity and/or lower resistance than in an off state. If the bias voltage greater than about the set threshold voltage VTHs is applied across resistive memory cell MC, the current carried by the resistive memory cell MC may change with a greater magnitude than a magnitude of changes in the applied bias voltage. as can be seen in the highly conductive region HCR of the curve GRs in FIG. 19. Similarly, a reset threshold voltage VTHr may correspond to an inflection point in the curve GRr where the resistive memory cell MC in the reset state begins to exhibit very large changes in the cell current, greater than the threshold current Ia, for small changes in the cell voltage. If the bias voltage of at least about the reset threshold voltage VTHr is applied across the resistive memory cell, the current carried by the resistive memory cell MC may change with a greater magnitude than a magnitude of changes in the bias voltage, as apparent in the highly conductive region HCR of the curve GRr in FIG. 19.

Hereinafter, example embodiments that the first nonvolatile memory device NVM1 is the NAND flash memory device and the second nonvolatile memory device NVM2 is the PRAM device will be described. The kinds or types of the first nonvolatile memory device NVM1 and the second nonvolatile memory device NVM2 may be determined variously on condition that the read speed of the second nonvolatile memory device NVM2 is higher than the read speed of the first nonvolatile memory device NVM1.

Figure 20:
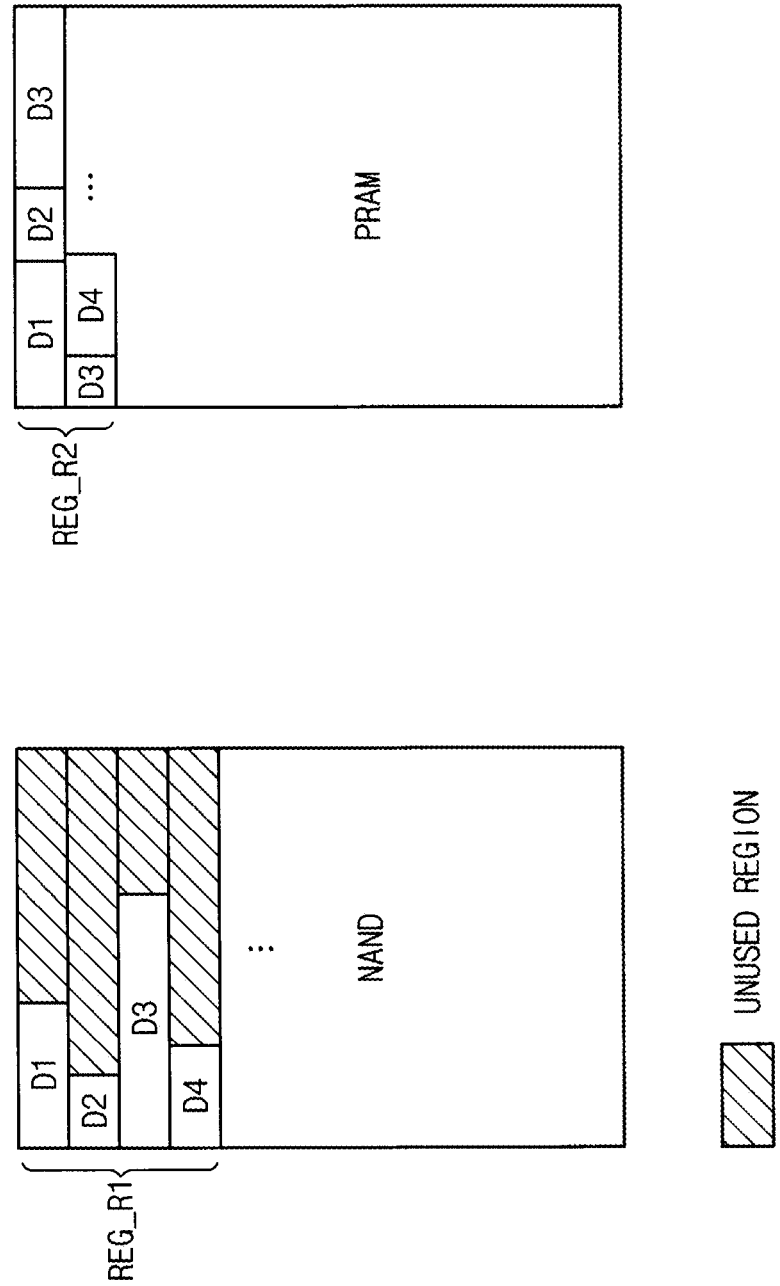
FIG. 20 is a diagram for describing a size of a memory region in which information data are stored.

FIG. 20 is a diagram for describing a size of a memory region in which information data are stored.

Referring to FIG. 20, the information data DINF may include a plurality of sub data D1~D4. In general, the PRAM device is accessed by units of byte and the NAND flash memory device is accessed by units of data block which is much larger than byte. Therefore a large portion of the memory region in which data are stored may remain as unused regions.

As a result, a size of a memory region REG_R2 storing the information data DINF of the second nonvolatile memory device such as the PRAM device is smaller than a size of a memory region REG_R1 storing the information data DINF of the first nonvolatile memory device such as the NAND flash memory device.

Figure 21:
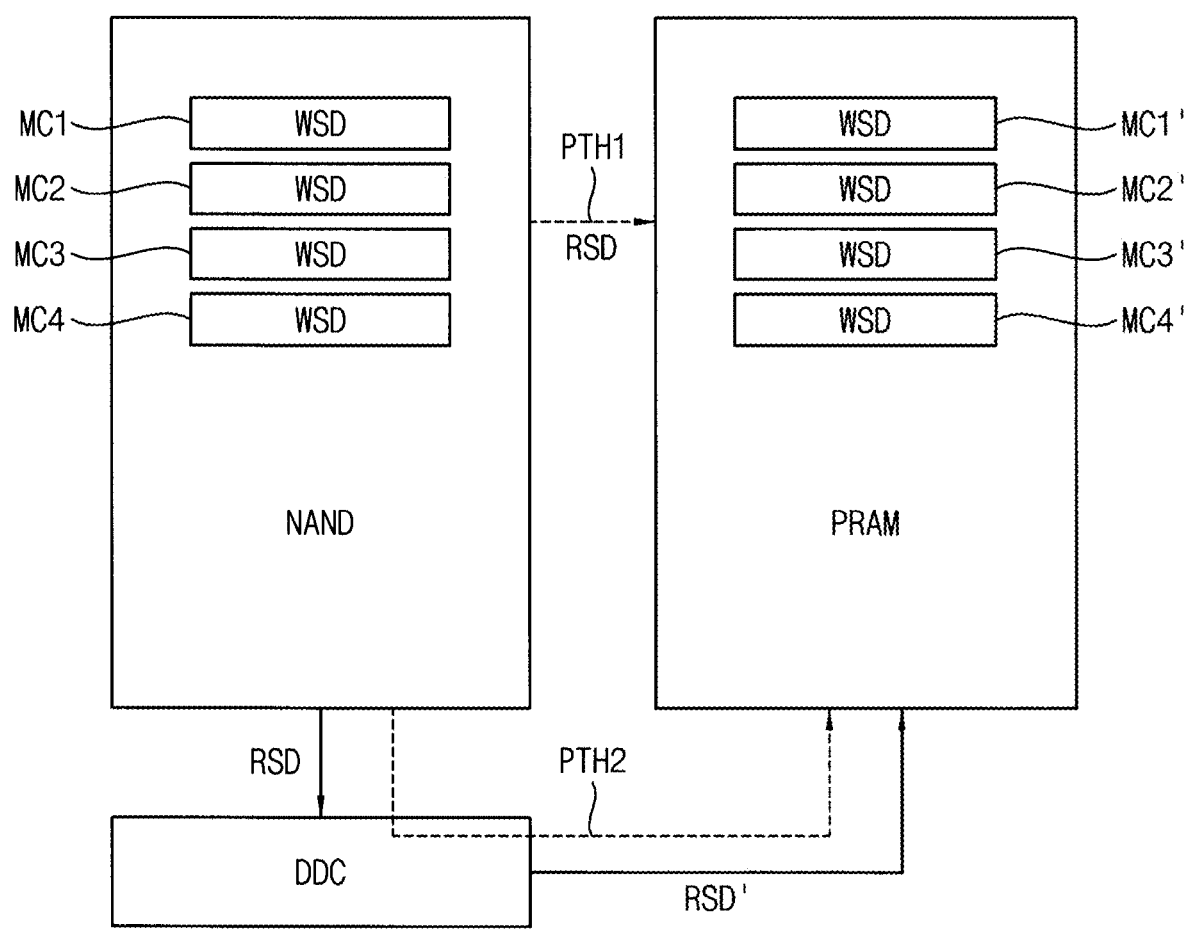
FIGS. 21, 22 and 23 are diagrams illustrating a method of storing information data according to example embodiments.
Figure 22:
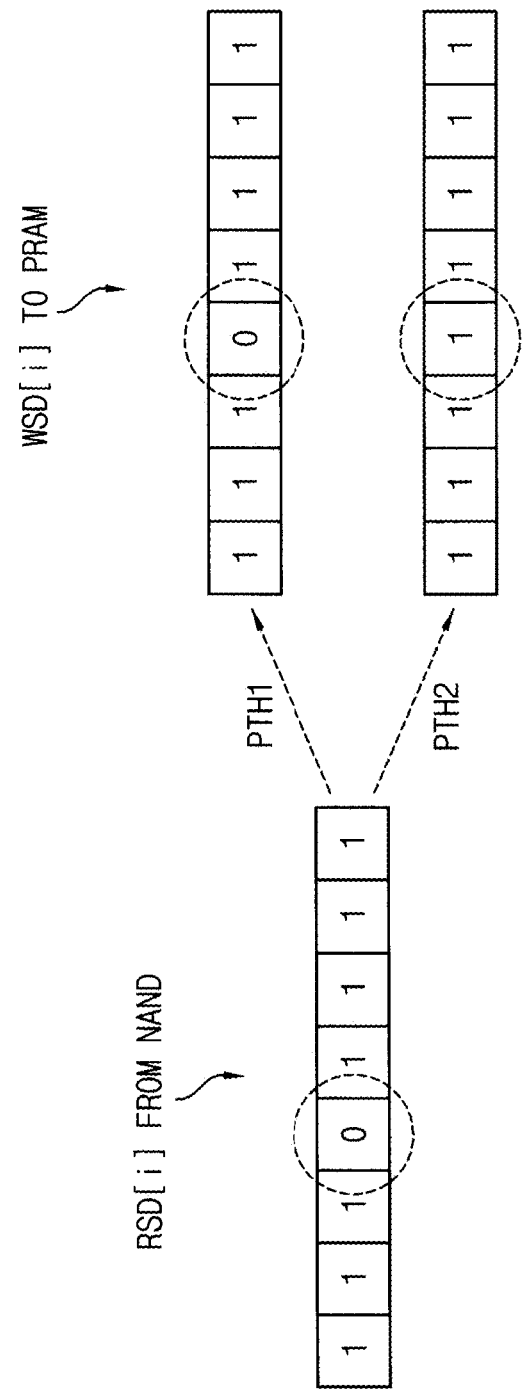
Figure 23:
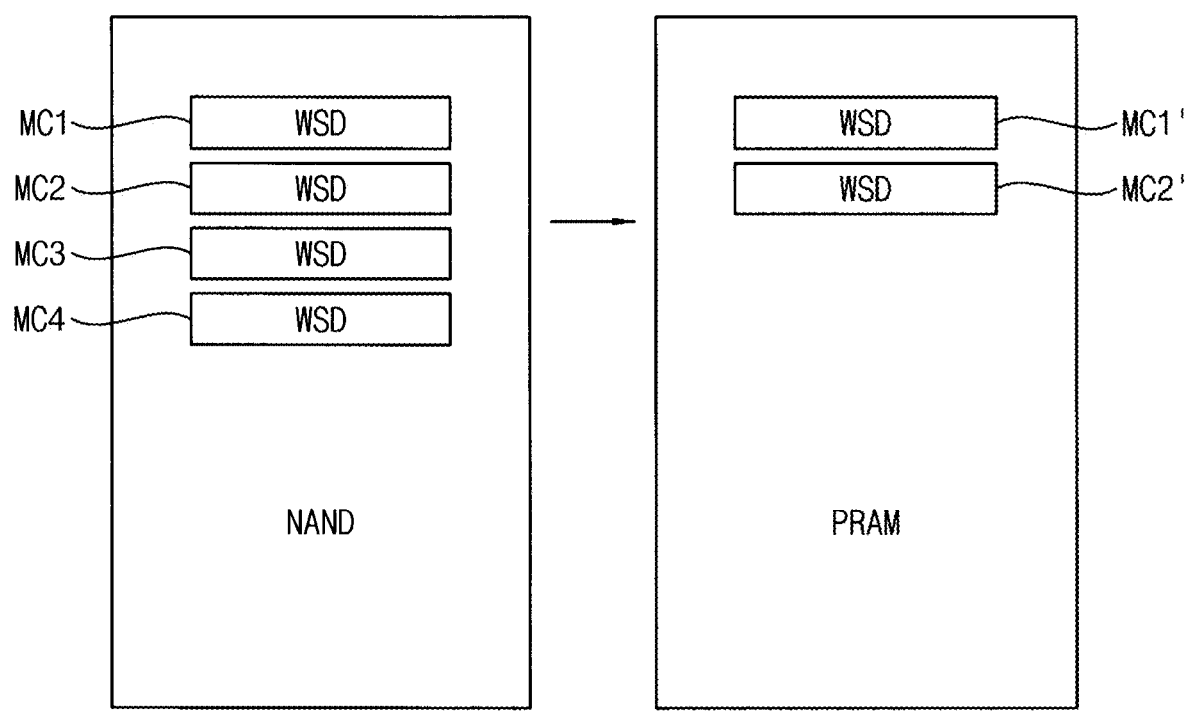

FIGS. 21, 22 and 23 are diagrams illustrating a method of storing information data according to example embodiments.

Referring to FIG. 21, a size of the information data DINF stored in the PRAM device is equal to a size of the information data DINF stored in the NAND flash memory device. In other words, the information data DINF may be stored repeatedly N times as the N write information data WSD in the memory cells MC1~MC4 of the NAND flash memory device before assembling the memory system where N is an integer greater than one (e.g., N=4 as illustrated in FIG. 21), and the information data DINF may be stored repeatedly N times as the N write information data WSD in the memory cells MC1'-MC4' of the PRAM device after assembling the memory system.

In some example embodiments, when the information data DINF are moved from the NAND flash memory device to the PRAM device, the information data DINF may be read from the NAND flash memory device and the read information data RSD read from the NAND flash memory device may be stored in the PRAM device without verifying validity of the read information data RSD read from the NAND flash memory device along the first path PTH1. In this case, as represented by the first path PTH1 in FIG. 22, the error bit (indicated by the dotted circle) of the read information data RSD[i] from the NAND flash memory device may be stored, as it is, in the PRAM device as the write information data WSD[i].

In other example embodiments, when the information data DINF are moved from the NAND flash memory device to the PRAM device, the dump-down circuit DDC may read the information data DINF from the NAND flash memory device, correct errors of the read information data RSD by verifying validity of the read information data RSD from the NAND flash memory device, and store error-corrected information data RSD' in the PRAM device along the second path PTH2. In this case, as represented by the second path PTH2 in FIG. 22, the error bit (indicated by the dotted circle) of the data RSD[i] read from the NAND flash memory device may be corrected and the corrected data may be stored in the PRAM device as the write information data WSD[i].

Referring to FIG. 23, a size of the information data DINF stored in the PRAM device may be smaller than a size of the information data DINF stored in the NAND flash memory device. In other words, the information data DINF may be stored repeatedly N times as the N write information data WSD in the memory cells MC1~MC4 of the NAND flash memory device before assembling the memory system where N is an integer greater than one (e.g., N=4 as illustrated in FIG. 22), and the information data DINF may be stored repeatedly M times as the M write information data WSD in the memory cells MC1' and MC2' of the PRAM device after assembling the memory system where M is an integer smaller than N (e.g., M=2 as illustrated in FIG. 22).

Figure 24:
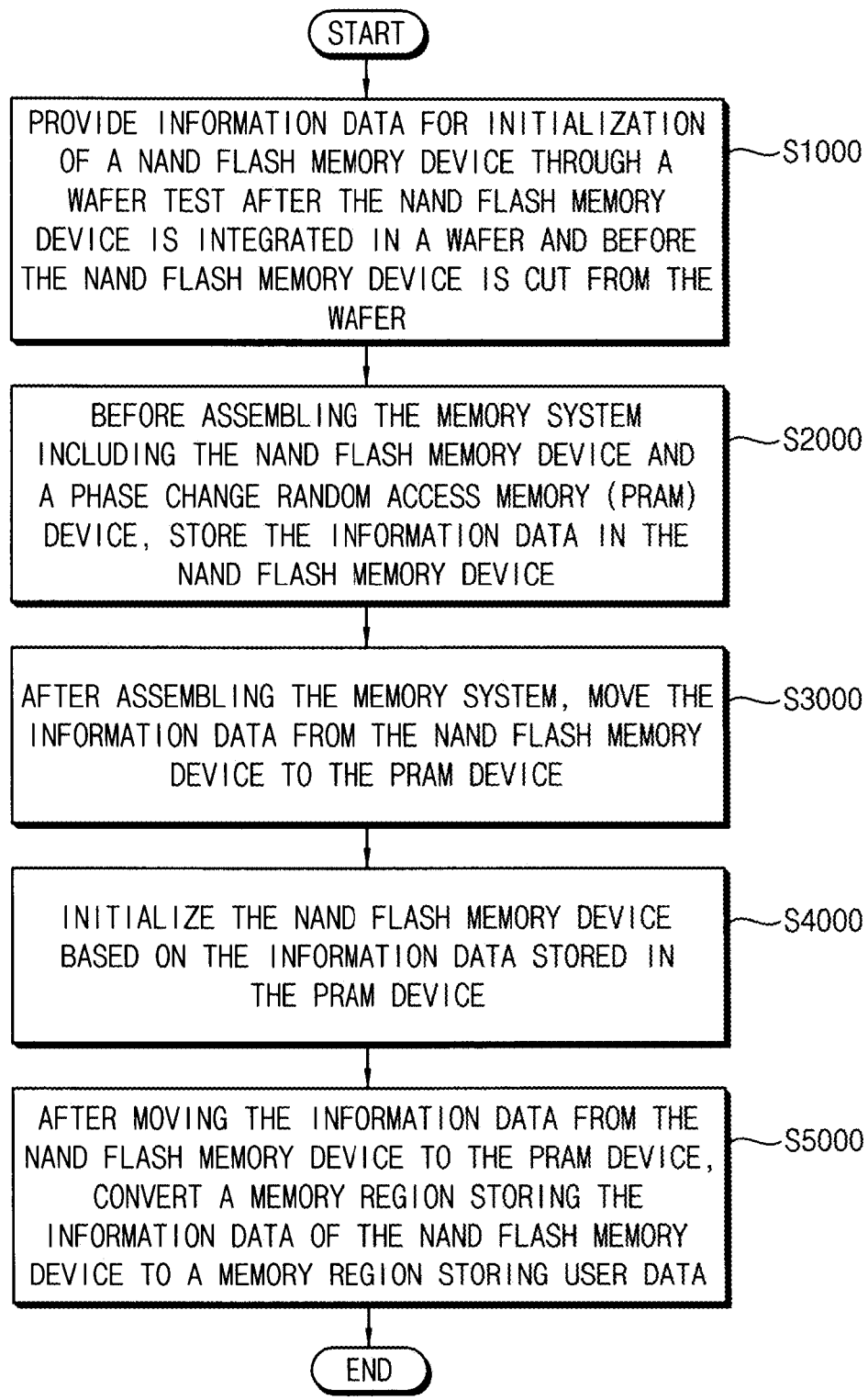
FIG. 24 is a flow chart illustrating a method of controlling initialization of a nonvolatile memory device according to example embodiments.

FIG. 24 is a flow chart illustrating a method of controlling initialization of a nonvolatile memory device according to example embodiments.

Referring to FIG. 24, in operation S1000, information data for initialization of a NAND flash memory device may be provided through a wafer test after the NAND flash memory device is integrated in a wafer and before the NAND flash memory device is cut from the wafer.

Before assembling the memory system including the NAND flash memory device and a phase change random access memory (PRAM) device, in operation S2000, the information data may be stored in the NAND flash memory device.

After assembling the memory system, in operation S3000, the information data may be moved from the NAND flash memory device to the PRAM device.

In operation 54000, the NAND flash memory device may be initialized based on the information data stored in the PRAM device. Operations S2000, S3000 and S4000 may be substantially the same as operations S100, S200, and 5300, respectively.

After moving the information data from the NAND flash memory device to the PRAM device, in operation 55000, a memory region storing the information data of the NAND flash memory device may be converted to a memory region storing user data.

FIGS. 25 through 29 are block diagrams illustrating a memory system according to example embodiments. Hereinafter, the descriptions repeated with FIG. 4 are omitted, and only the differences from the memory system 1000 of FIG. 4 are described.

Figure 25:
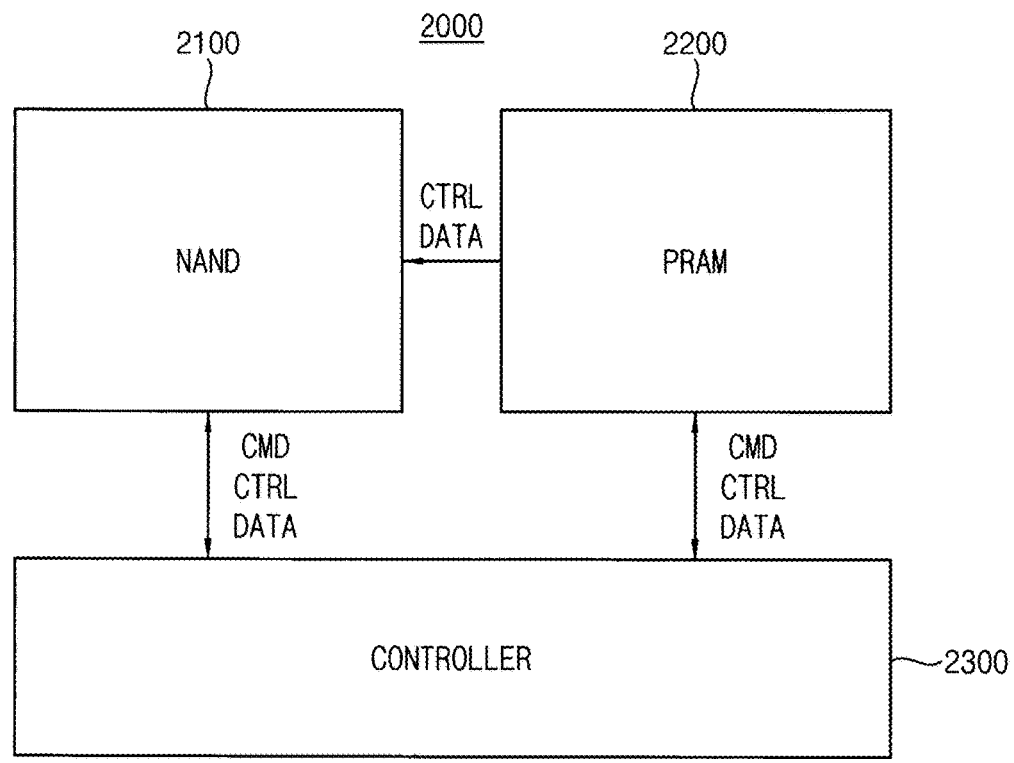
FIGS. 25 through 29 are block diagrams illustrating a memory system according to example embodiments.

Referring to FIG. 25, a memory system 2000 may include a NAND flash memory device 2100 corresponding to the first nonvolatile memory device NVM1, a PRAM device 2200 corresponding to the second nonvolatile memory device NVM2 and a controller 2300. The PRAM device 2200 may output a control signal CTRL and data DATA to the NAND flash memory device 2100. For example, the phase change memory 2200 may provide the NAND flash memory device 2100 with the information data DINF as data DATA. The PRAM device 2200 may output a control signal CTRL (e.g., a data strobe signal DQS) to the NAND flash memory device 2100.

Figure 26:
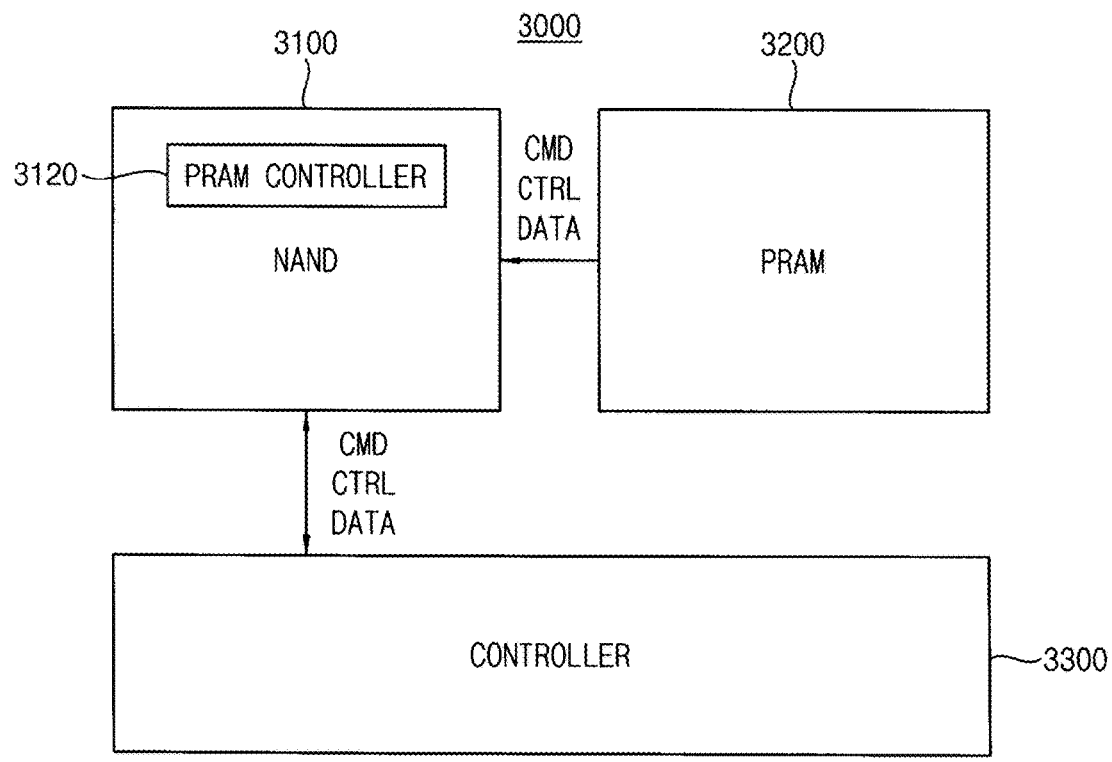

Referring to FIG. 26, a memory system 32000 may include a NAND flash memory device 3100 corresponding to the first nonvolatile memory device NVM1, a PRAM device 3200 corresponding to the second nonvolatile memory device NVM2 and a controller 3300. The NAND flash memory device 3100 may include a PRAM controller 3120 and the PRAM device 3200 may be operated under control of the PRAM controller 3120. The PRAM device 3200 may not communicated with the controller 3300. That is, the PRAM device 3200 may receive a control signal CTRL and a command CMD from the NAND flash memory device 3100, and may exchange data with the NAND flash memory device 3100.

Figure 27:
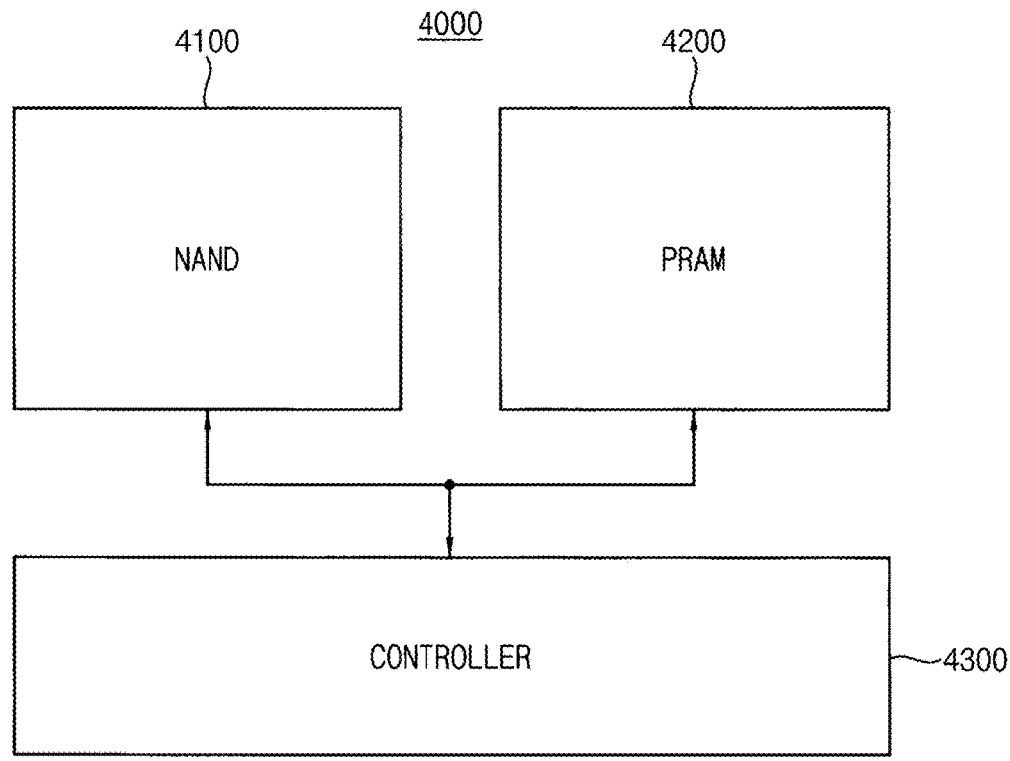

Referring to FIG. 27, a memory system 4000 may include a NAND flash memory device 4100 corresponding to the first nonvolatile memory device NVM1, a PRAM device 4200 corresponding to the second nonvolatile memory device NVM2 and a controller 4300. The controller 4300 may control the NAND flash memory device 4100 and PRAM device 4200 via a common bus. The NAND flash memory device 4100 and the PRAM device 4200 may communicate with controller 4300 in a time division scheme. The information data DINF stored in the PRAM device 4200 MY be directly transferred to the NAND flash memory device 4100 without passing through the controller 4300.

Figure 28:
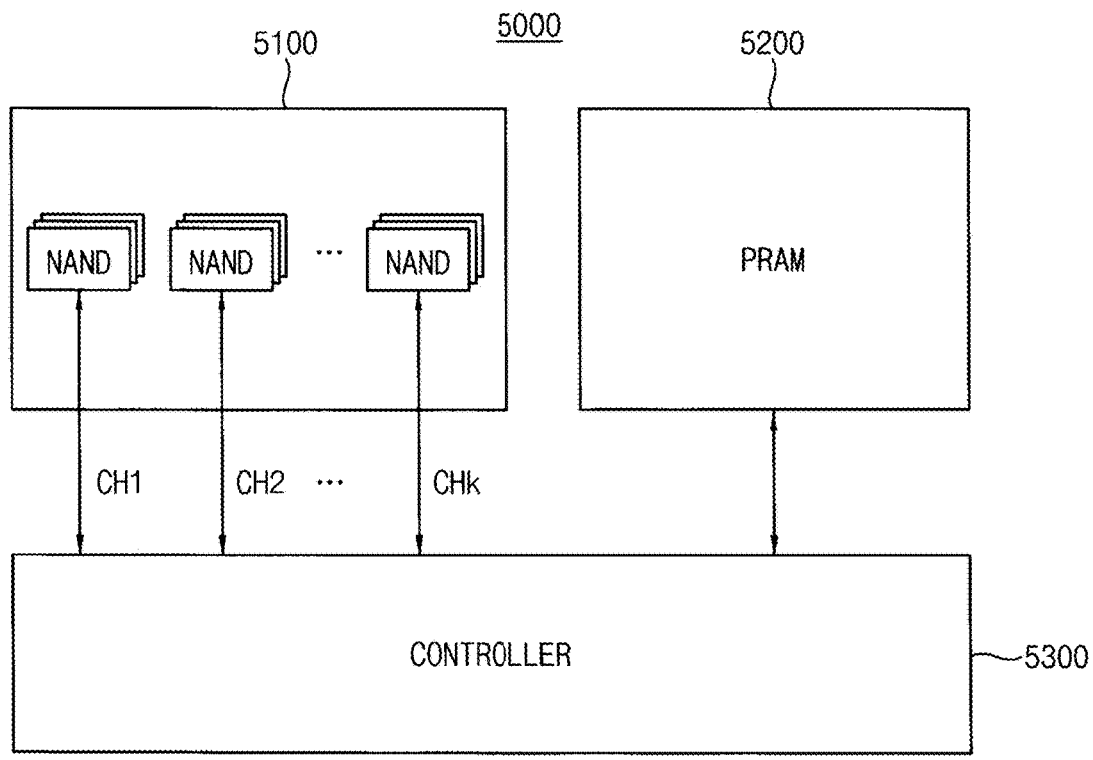

Referring to FIG. 28, a memory system 5000 may include a NAND flash memory device 5100 corresponding to the first nonvolatile memory device NVM1, a PRAM device 5200 corresponding to the second nonvolatile memory device NVM2 and a controller 5300. The NAND flash memory device 5100 may communicate with controller 5300 via a plurality of channels CH1 to CHk. Each channel may be connected with a plurality of NAND flash memory chips.

Figure 29:
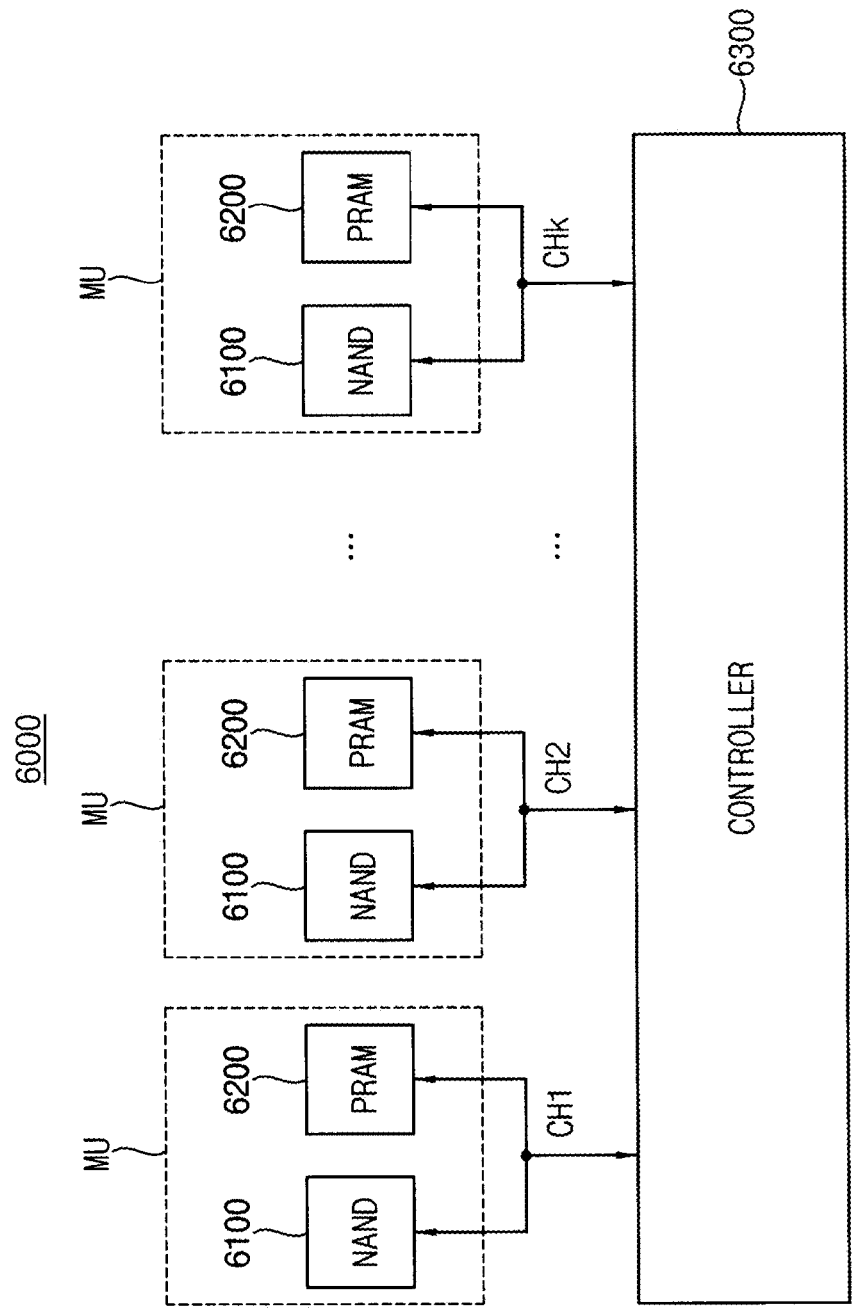

Referring to FIG. 29, a memory system 6000 may include a plurality of memory units MU and a controller 6300. The memory units MU may communicate with the controller 6300 via a plurality of channels CH1 to CHk. Each of the memory units MU may include at least one NAND flash memory device 6100 and a PRAM device 6200. In each memory unit MU, the NAND flash memory device 6100 and the PRAM device 6200 may communicate with the controller 6300 via a common channel. In each memory unit MU, the NAND flash memory device 6100 and the PRAM device 6200 may occupy the common channel in a time division scheme.

Figure 30:
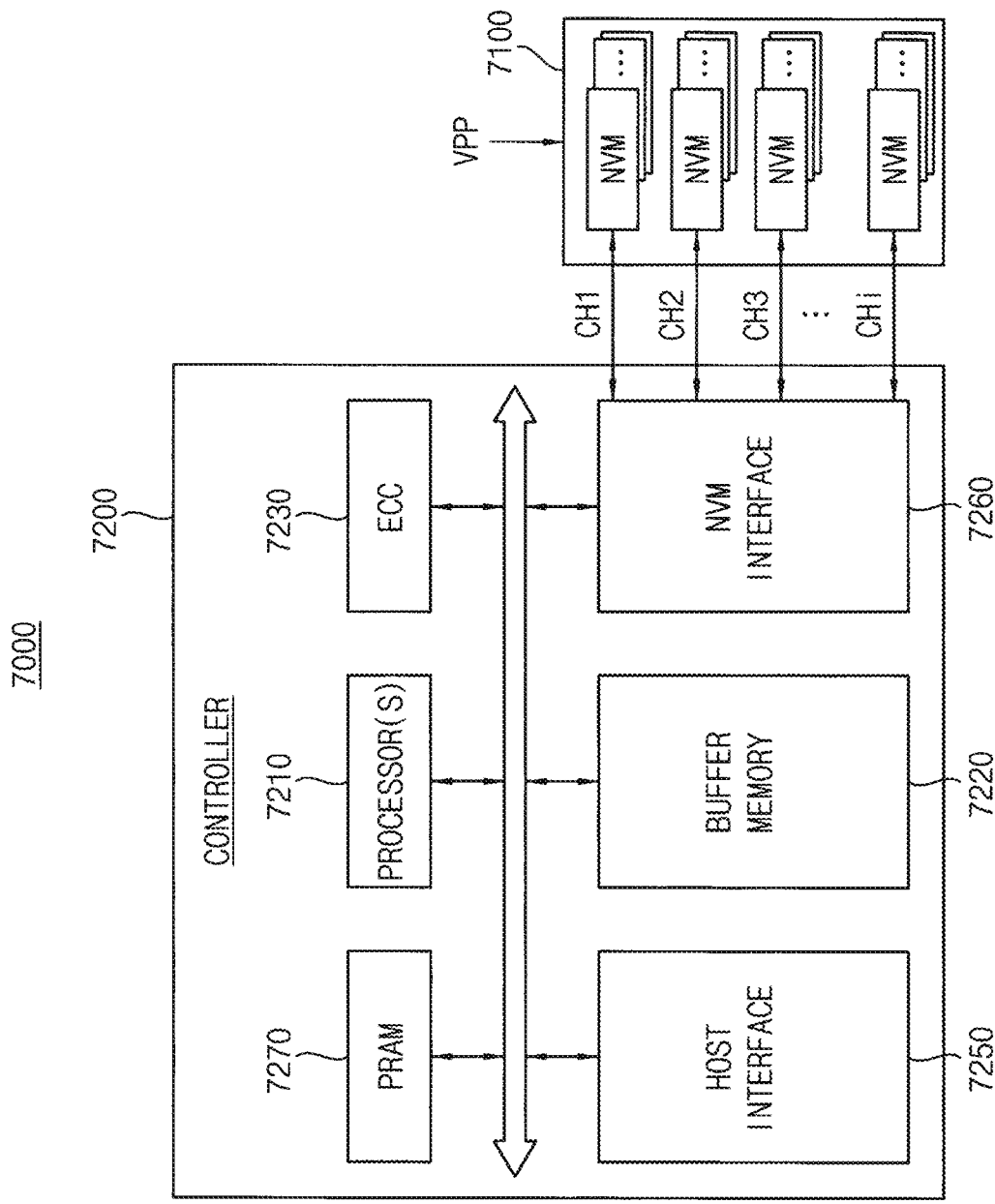
FIG. 30 is a block diagram illustrating a solid state disk or solid state drive (SSD) according to example embodiments.

FIG. 30 is a block diagram illustrating a solid state disk or solid state drive (SSD) according to example embodiments.

Referring to FIG. 30, an SSD 7000 includes multiple nonvolatile memory devices (NVM) 7100 and an SSD controller 7200.

The nonvolatile memory devices 7100 may be configured to receive a high voltage VPP. The nonvolatile memory devices 7100 may be the NAND flash memory devices corresponding to the first nonvolatile memory device as described above.

The SSD controller 7200 is connected to the nonvolatile memory devices 7100 through multiple channels CH1 to CHi, respectively. The SSD controller 7200 includes one or more processors 7210, a buffer memory 7220, an error correction code (ECC) circuit 7230, a host interface 7250, a nonvolatile memory interface 7260 and a PRAM device corresponding to the second nonvolatile memory device NVM2 as described above.

The buffer memory 7220 stores data used to drive the SSD controller 7200. The ECC circuit 7230 calculates error correction code values of data to be programmed at a writing operation and corrects an error of read data using an error correction code value at a read operation. In a data recovery operation, the ECC circuit 7230 corrects an error of data recovered from the nonvolatile memory devices 7100.

According to example embodiments, the processor 7210 may move the information data from the nonvolatile memory devices 7100 to the PRAM device 7270 after assembling the memory system, and initialize the nonvolatile memory devices 7100 based on the information data stored in the PRAM device 7270.

Even though FIG. 30 illustrates an example embodiment that the SSD controller 7200 includes the one PRAM device 7270, the position of the PRAM device, the number of the PRAM device and the interface of the PRAM device with the other components may be implemented variously as described with reference to FIGS. 25 through 29.

Some of the elements of the memory systems, described above, such as the controller 1300, 2300, 3300, 4300, 5300, and 6300 and the control circuit 450 of the first non-volatile memory having the dump-down circuit 100 therein including the verification circuits VRFC1, VRFC2 and dump-down control logic DDCL may be implemented in processing circuitry such as hardware including logic circuits; a hardware/software combination such as a processor executing software; or a combination thereof and memory. For example, the processing circuitry more specifically may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc. The processing circuitry may be special purpose processing circuitry configured to move information data DINF and special data DSPC from a memory region of first nonvolatile memory device NVM1 to a second nonvolatile memory device NVM2 after assembling the memory system 1000, initialize the first nonvolatile memory device NVM1 based on the information data DINF stored in the second nonvolatile memory device NVM2 by setting values of electric fuse circuit, and control the operation of the first nonvolatile memory device NVM1 based on the set values of the electric fuse circuit 300. In some example embodiments, the special purpose processing circuitry may further convert the memory region storing the information data of the first nonvolatile memory device to a memory region for storing user data. As such, the processing circuitry may improve the functioning of the memory system by efficiently reduce an initialization time of the first nonvolatile memory device and may efficiently utilize the memory space of the first nonvolatile memory device and reduce the cost of the system by converting the memory region storing the information data of the first nonvolatile memory device to the memory region storing the user data.

Example embodiments of the inventive concepts may be applied to any electronic devices and systems. For example, the inventive concept may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concepts.

What is claimed is:

1. A method of controlling initialization of a first nonvolatile memory device included in a memory system, the memory system including at least the first nonvolatile memory device and a second nonvolatile memory device having a greater speed associated with performing a read operation than that of the first nonvolatile memory device, the method comprising:

storing information data for initialization of the first nonvolatile memory device in the first nonvolatile memory device before assembling the memory system;

moving the information data from the first nonvolatile memory device to the second nonvolatile memory device after assembling the memory system; and initializing the first nonvolatile memory device based on the information data stored in the second nonvolatile memory device.

2. The method of claim 1, wherein the first nonvolatile memory device is a NAND flash memory device and the second nonvolatile memory device is a phase change random access memory (PRAM) device.

3. The method of claim 1, further comprising:
converting a memory region of the first nonvolatile memory device associated with storing the information data to a memory region storing user data after moving the information data from the first nonvolatile memory device to the second nonvolatile memory device.

4. The method of claim 1, wherein the moving moves the information data to a memory region of the second nonvolatile memory device such that a size of the memory region of the second nonvolatile memory device storing the information data is smaller than a size of a memory region of the first nonvolatile memory device associated with storing the information data.

5. The method of claim 1, wherein the moving moves the information data to the second nonvolatile memory device such that a size of the information data stored in the second nonvolatile memory device is equal to a size of the information data previously stored in the first nonvolatile memory device.

6. The method of claim 1, wherein
the storing includes storing the information data repeatedly N times in the first nonvolatile memory device before assembling the memory system, where N is an integer greater than one, and
the moving includes storing the information data repeatedly N times in the second nonvolatile memory device after assembling the memory system.

7. The method of claim 1, wherein the moving moves the information data to the second nonvolatile memory device such that a size of the information data stored in the second nonvolatile memory device is smaller than a size of the information data previously stored in the first nonvolatile memory device.

8. The method of claim 1, wherein
the storing includes storing the information data repeatedly N times in the first nonvolatile memory device before assembling the memory system where N is an integer greater than one, and
the moving includes storing the information data repeatedly M times in the second nonvolatile memory device after assembling the memory system, where M is an integer smaller than N.

9. The method of claim 1, wherein the moving the information data comprises:
reading the information data from the first nonvolatile memory device; and
storing the information data read from the first nonvolatile memory device in the second nonvolatile memory device without verifying a validity of the information data read from the first nonvolatile memory device.

10. The method of claim 1, wherein the moving the information data comprises:
reading the information data from the first nonvolatile memory device;
verifying a validity of the information data read from the first nonvolatile memory device to generate error-corrected information data; and
storing the error-corrected information data in the second nonvolatile memory device.

11. The method of claim 1, further comprising:
receiving the information data through a wafer test after the first nonvolatile memory device is integrated in a wafer and before the first nonvolatile memory device is cut from the wafer.

12. The method of claim 11, further comprising:
pre-assembly initializing the first nonvolatile memory device based on the information data stored in the first nonvolatile memory device, after cutting the first nonvolatile memory device from the wafer and before assembling the first nonvolatile memory device in the memory system;
performing a single-device test of the first nonvolatile memory device after pre-assembly initializing the first nonvolatile memory device; and
providing special data for an operation of the first nonvolatile memory device based on results of the single-device test.

13. The method of claim 12, further comprising:
storing the special data in the second nonvolatile memory device.

14. The method of claim 13, wherein storing the special data comprises:
storing the special data from a tester device in the first nonvolatile memory device before assembling the memory system; and
moving the special data from the first nonvolatile memory device to the second nonvolatile memory device after assembling the memory system.

15. A memory system comprising;
a first nonvolatile memory device configured to store information data for initialization of the first nonvolatile memory device before assembling the first nonvolatile memory device in the memory system;
a second nonvolatile memory device having a greater speed associated with performing a read operation than that of the first nonvolatile memory device; and
a controller configured to,
move the information data from the first nonvolatile memory device to the second nonvolatile memory device after assembling the memory system, and
initialize the first nonvolatile memory device based on the information data stored in the second nonvolatile memory device.

16. The memory system of claim 15, wherein the first nonvolatile memory device is a NAND flash memory device and the second nonvolatile memory device is a phase change random access memory (PRAM) device.

17. The memory system of claim 15, wherein the memory system is configured to communicate with a testing device, the testing device configured to provide the information data through a wafer test after the first nonvolatile memory device is integrated in a wafer and before the first nonvolatile memory device is cut from the wafer.

18. A method of controlling initialization of a NAND flash memory device included in a memory system, the method comprising:
providing information data for initialization of the NAND flash memory device through a wafer test after the NAND flash memory device is integrated in a wafer and before the NAND flash memory device is cut from the wafer;

storing the information data in the NAND flash memory device before assembling the memory system;

moving the information data from the NAND flash memory device to a PRAM device included in the memory system after assembling the memory system;

initializing the NAND flash memory device based on the information data stored in the PRAM device; and converting a memory region of the NAND flash memory device associated with storing the information data to a memory region storing user data after moving the information data from the NAND flash memory device to the PRAM device.

19. The method of claim 18, wherein the providing the information data comprises:

performing the wafer test after the NAND flash memory device is integrated in the wafer and before the NAND flash memory device is cut from the wafer.

\* \* \* \* \*